US010362248B2

(12) United States Patent
Tanaka

(10) Patent No.: US 10,362,248 B2
(45) Date of Patent: Jul. 23, 2019

(54) SOLID-STATE IMAGING DEVICE AND CAMERA SYSTEM

(71) Applicant: Sony Corporation, Tokyo (JP)

(72) Inventor: Kenichi Tanaka, Nagasaki (JP)

(73) Assignee: Sony Corporation, Tokyo (JP)

(*) Notice: Subject to any disclaimer, the term of this patent is extended or adjusted under 35 U.S.C. 154(b) by 344 days.

(21) Appl. No.: 15/264,046

(22) Filed: Sep. 13, 2016

(65) Prior Publication Data
US 2016/0381312 A1 Dec. 29, 2016

Related U.S. Application Data

(63) Continuation of application No. 15/078,979, filed on Mar. 23, 2016, now Pat. No. 9,456,162, which is a (Continued)

(30) Foreign Application Priority Data

Nov. 15, 2007 (JP) ................. 2007-297268

(51) Int. Cl.
H03M 1/34 (2006.01)
H04N 5/235 (2006.01)
(Continued)

(52) U.S. Cl.
CPC ............ H04N 5/3658 (2013.01); H03M 1/34 (2013.01); H04N 5/235 (2013.01); H04N 5/365 (2013.01);
(Continued)

(58) Field of Classification Search
CPC ........ H04N 5/235; H04N 5/365; H04N 5/374; H04N 5/37455; H04N 5/378; H03M 1/002; H03M 1/34; H03M 1/56
See application file for complete search history.

(56) References Cited

U.S. PATENT DOCUMENTS 5,214,301 A 5/1993 Kosa et al.
6,618,085 B2 9/2003 Ishimoto
(Continued)

FOREIGN PATENT DOCUMENTS

JP 2005-278135 10/2005

OTHER PUBLICATIONS

Yang et al., "An Integrated 800.times.600 CMOS Image System", ISSCC Digest of Technical Papers, pp. 304-305, Feb. 1999.

Primary Examiner — Chia Wei A Chen
(74) Attorney, Agent, or Firm — Michael Best & Friedrich LLP

(57) ABSTRACT

A solid-state imaging device and a camera system are provided. The solid-state imaging device capable of performing an intermittent operation includes a pixel unit and a pixel signal readout unit for reading out a pixel signal from the pixel unit in units of a plurality of pixels for each column. The pixel signal readout circuit includes a plurality of comparators and a plurality of counters whose operations are controlled by outputs of the comparators. Each of the comparators includes an initializing switch for determining an operating point for each column at a start of row operation, and is configured so that an initialization signal to be applied to the initializing switch is controlled independently in parallel only a basic unit of the initialization signal used for a horizontal intermittent operation, and the initializing switch is held in an off-state at a start of non-operating row.

12 Claims, 15 Drawing Sheets

Related U.S. Application Data continuation of application No. 14/633,771, filed on Feb. 27, 2015, now abandoned, which is a continuation of application No. 14/592,945, filed on Jan. 9, 2015, now Pat. No. 9,204,075, which is a continuation of application No. 14/263,618, filed on Apr. 28, 2014, now Pat. No. 8,976,284, which is a continuation of application No. 13/940,391, filed on Jul. 12, 2013, now Pat. No. 8,749,684, which is a continuation of application No. 13/412,565, filed on Mar. 5, 2012, now Pat. No. 8,508,642, which is a continuation of application No. 12/261,790, filed on Oct. 30, 2008, now Pat. No. 8,179,465.

(51) Int. Cl.
*H04N 5/365* (2011.01)
*H04N 5/374* (2011.01)
*H04N 5/378* (2011.01)
*H04N 5/3745* (2011.01)

(52) U.S. Cl.
CPC ............ *H04N 5/374* (2013.01); *H04N 5/378* (2013.01); *H04N 5/37455* (2013.01)

(56) References Cited

U.S. PATENT DOCUMENTS

| | | | |
|---|---|---|---|
| 6,691,145 B1 * | 2/2004 | Shibata | G06G 7/14 375/E7.209 |
| 6,885,396 B1 | 4/2005 | Panicacci et al. | |
| 7,321,329 B2 | 1/2008 | Tooyama et al. | |
| 7,852,331 B2 * | 12/2010 | Garverick | G09G 3/34 345/211 |
| 7,952,510 B2 | 5/2011 | Shimomura et al. | |
| 8,179,465 B2 | 5/2012 | Tanaka | |
| 8,466,995 B2 | 6/2013 | Suzuki et al. | |
| 8,976,284 B2 | 3/2015 | Tanaka | |
| 9,456,162 B2 * | 9/2016 | Tanaka | H04N 5/365 |
| 2003/0146991 A1 | 8/2003 | Barna et al. | |
| 2003/0218559 A1 | 11/2003 | Suzuki et al. | |
| 2004/0036783 A1 * | 2/2004 | Barna | H04N 5/3598 348/300 |
| 2004/0085237 A1 | 5/2004 | Fossum et al. | |
| 2005/0195304 A1 | 9/2005 | Nitta et al. | |
| 2006/0097902 A1 * | 5/2006 | Muramatsu | H03K 5/2481 341/155 |
| 2006/0119399 A1 * | 6/2006 | Tam | G11C 27/028 327/66 |
| 2006/0145906 A1 | 7/2006 | Boemler | |
| 2006/0170795 A1 | 8/2006 | Higuchi et al. | |
| 2007/0008206 A1 | 1/2007 | Tooyama et al. | |
| 2007/0030190 A1 * | 2/2007 | Lee | H03M 1/002 341/155 |
| 2007/0096972 A1 | 5/2007 | Kobayashi et al. | |
| 2007/0139242 A1 | 6/2007 | Krymski | |
| 2007/0146514 A1 | 6/2007 | Maeda et al. | |
| 2007/0216564 A1 * | 9/2007 | Koseki | H03M 1/0604 341/155 |
| 2011/0199351 A1 | 8/2011 | Kurokawa | |

\* cited by examiner

SOLID-STATE IMAGING DEVICE AND CAMERA SYSTEM

CROSS-REFERENCE TO RELATED APPLICATIONS

The present application is a Continuation of U.S. application Ser. No. 15/078,979, filed Mar. 23, 2016, now U.S. Pat. No. 9,456,162, issuing on Sep. 27, 2016, which is a Continuation of U.S. application Ser. No. 14/633,771, filed Feb. 27, 2015, which is a Continuation of U.S. application Ser. No. 14/592,945, filed Jan. 9, 2015, now U.S. Pat. No. 9,204,075, issued Dec. 1, 2015, which is a Continuation of U.S. application Ser. No. 14/263,618, filed Apr. 28, 2014, now U.S. Pat. No. 8,976,284, issued Mar. 10, 2015, which is a Continuation of U.S. application Ser. No. 13/940,391, filed Jul. 12, 2013, now U.S. Pat. No. 8,749,684, issued Jun. 10, 2014, which is a Continuation of U.S. application Ser. No. 13/412,565, filed Mar. 5, 2012, now U.S. Pat. No. 8,508,642, issued Aug. 13, 2013, which is a Continuation of U.S. application Ser. No. 12/261,790, filed Oct. 30, 2008, now U.S. Pat. No. 8,179,465, issued May 15, 2012, which claims priority to Japanese patent Application No. 2007-297268 filed in the Japanese Patent Office on Nov. 15, 2007, the entire disclosure of which is incorporated herein by reference.

BACKGROUND OF THE INVENTION

1. Field of the Invention

The present invention relates to a solid-state imaging device as typified by a complementary metal-oxide semiconductor (CMOS) image sensor, and a camera system.

2. Description of Related Art

In recent years, a complementary metal-oxide semiconductor (CMOS) image sensor has been paid attention as a solid-state imaging device (image sensor) to be substituted for a charge-coupled device (CCD).

This is because the CMOS image sensor overcomes various issues of CCD, including the necessity for dedicated processes for manufacturing CCD pixels and for a plurality of power supply voltages for CCD operation, and a very complicated system because a plurality of peripheral ICs are required to be combined for the operation.

A CMOS image sensor has a plurality of large merits: manufacturing processes similar to those for a general CMOS type integrated circuit can be used for manufacturing CMOS image sensors, a single power supply can drive a CMOS image sensor, and the number of peripheral ICs can be reduced because analog circuits and logic circuits manufactured by CMOS processes can be used being mixed on the same chip.

A main trend of a CCD output circuit is one channel (1-ch) output by using a floating diffusion (FD) amplifier having an FD layer.

In contrast, a main trend of a CMOS image sensor is a column parallel type in which each pixel is provided with an FD amplifier, and by selecting each row of a pixel array, and outputs of FD amplifiers are read in a column direction at the same time.

This is because it is considered that the FD amplifier disposed in each pixel is difficult to obtain a sufficient drive capability, resulting in a need for lowering the data rate, so that that parallel processing is advantageous.

Various signal output circuits have been truly proposed for a column parallel output type CMOS image sensor.

As a method used for pixel signal readout operation of the CMOS image sensor, there is a method by which signal charges to be used as an optical signal generated by a photoelectric conversion element, such as a photodiode, are sampled temporarily via a MOS switch disposed near the photoelectric conversion element in a capacitor, and the signal charges are read out.

Noises having inverse correlation to a sampling capacitor value are generally superposed upon a sampling circuit. In a pixel, when signal charges are transferred to the sampling capacitor, the signal charges are fully transferred by utilizing a potential gradient so that noises will occur at the sampling stage. However, noises are superposed when a voltage level of capacitor is reset to a reference value, which is the previous stage of the sampling.

In order to remove the noises, a correlated double sampling (CDS) is generally used. With this method, a state (reset level) immediately before sampling signal charges is read out and stored, and then a signal level after sampling is read out so that the read out signal level is subtracted from that of the stored charges, thereby eliminating the noises.

There are various specific methods of the CDS.

A general CMOS image sensor will be described below.

FIG. 1 is a diagram showing an example of a pixel of a CMOS image sensor composed of four transistors.

This pixel 10 includes, for example, a photodiode 11 as a photoelectric conversion element, and four transistors as active elements for one photodiode 11. The four transistors include a transfer transistor 12, an amplifier transistor 13, a selection transistor 14, and a reset transistor 15.

The photodiode 11 photoelectrically converts an incident light into an amount of electric charge (here, it is an electron) corresponding to the amount of the incident light.

The transfer transistor 12 is connected between the photodiode 11 and a floating diffusion FD. Upon application of a drive signal to the gate (transfer gate) of the transfer transistor via a transfer control line LTx, the transfer transistor 12 transfers the electrons photoelectrically converted by the photodiode 11 to the floating diffusion FD.

A gate of the amplifier transistor 13 is connected to the floating diffusion FD. The amplifier transistor 13 is connected to a signal line LSGN via the selection transistor 14. The amplifier transistor 13 and a constant power supply 16 located outside the pixel unit constitute a source follower.

Through the select control line LSEL, an address signal is supplied to the gate of the selection transistor 14, and when the selection transistor 14 turns on, the amplifier transistor 13 amplifies a potential of the floating diffusion to output a voltage corresponding to the potential to the output (vertical) signal line LSGN. The signal voltage outputted from each pixel is outputted to a pixel signal readout circuit via the signal line LSGN.

The reset transistor 15 is connected between a power supply line LVDD and the floating diffusion FD. When a reset signal is supplied to the gate of the reset transistor via a reset control line LRST, the reset transistor resets a potential of the floating diffusion FD to a potential of the power supply line LVDD.

More specifically, when the pixel is reset, the transfer transistor 12 is turned on to sweep-out charges accumulated in the photoelectric conversion element 11, and then the transfer transistor 12 is turned off to make the photoelectric conversion element 11 convert an optical signal into charges and accumulate the charges.

When the pixel is read out, the reset transistor 15 is turned on to reset the floating diffusion FD, and then the reset transistor 15 is turned off to output a voltage of the floating diffusion FD via the amplifier transistor 13 and the selection transistor 14. The output at this time is defined as a P-phase voltage.

Next, the transfer transistor 12 is turned on to transfer charges accumulated in the photoelectric conversion element 22 to the floating diffusion FD, and a voltage of the floating diffusion FD is outputted by the amplifier transistor 13. The output at this time is defined as a D-phase output.

By using a difference between the D-phase output and the P-phase output as an image signal, it becomes possible to remove not only variations in DC component of the output per each pixel but also a FD reset noise of the floating diffusion from the image signal.

These operations are performed for pixels of one row at a time because the respective gates of, e.g., the transfer transistor 12, the selection transistor 14, and the reset transistor 15 are connected in units of the row.

Various pixel signal readout (output) circuits of a column parallel output type CMOS image sensor have been proposed. One of the most advanced types of this circuit has an analog-digital converter unit (hereinafter abbreviated to ADC (analog digital converter)) disposed for each column to output a pixel signal as a digital signal.

A CMOS image sensor mounting the column parallel ADC of this type is disclosed, for example, in W. Yang et. al., "An integrated 800.times.600 CMOS Image System" ISSCC Digest of Technical Papers, pp. 304 and 305, February, 199) and Japanese Unexamined Patent Application Publication No. 2005-278135.

FIG. 2 is a block diagram showing a configuration example of the solid-state imaging device (CMOS image sensor) mounting a column parallel ADC.

As shown in FIG. 2, the solid-state imaging device 20 includes a pixel unit 21 as an imaging unit, a vertical scanning circuit 22, a horizontal transfer scanning circuit 23, a timing control circuit 24, an ADC group 25, a digital-analog conversion unit (hereinafter abbreviated to DAC (digital-analog converter)) 26, an amplifier circuit (S/A) 27, and a signal processing circuit 28.

The pixel unit 21 includes photodiodes and intra-pixel amplifiers, and is constituted of pixels such as shown in FIG. 1 disposed in a matrix shape.

In the solid-state imaging device 20, the timing control circuit 24, the vertical scanning circuit 22, and the horizontal scanning circuit 23 are disposed as the control circuit for sequentially reading out a signal from the pixel unit 21. The timing control circuit generates internal clocks. The vertical scanning circuit 22 controls row addressing and row scanning. The horizontal transfer scanning circuit 23 controls column addressing and column scanning.

The ADC group 25 includes ADCs disposed at a plurality of columns, each of which includes a comparator 25-1, a counter 25-2, and a latch 25-3. The comparator 25-1 compares a reference voltage Vslop having a ramp waveform obtained by stepwise changing a reference voltage generated by DAC 26 with an analog signal obtained from a pixel at each row via a vertical signal line. The counter 25-2 counts a comparison time. The latch 25-3 holds a count result.

The ADC group 25 has an n-bit digital signal conversion function, each ADC being disposed at each vertical signal line (column line) to constitute a column parallel ADC block.

An output of each latch 25-3 is connected to a horizontal transfer line 29 having, for example, a 2n-bit width.

Amplifier circuits 27 the number of which is 2n corresponding to the horizontal transfer line 29, and a signal processing circuit 28 are disposed.

In the ADC group 25, an analog signal (potential Vs1) read out to the vertical signal line is compared with the reference voltage Vslop (a slope waveform having a gradient and changing linearly) at the comparator 25-1 disposed at each column.

In this case, the counter 25-2 disposed at each column similar to the comparator 25-1 is in operation and changes its count in one-to-one correspondence with the potential Vslop of the ramp waveform, to thereby convert a potential (analog signal) Vs1 at a vertical signal line into a digital signal.

A change in the reference voltage Vslop is used for converting a voltage change into a time change, and the converted time is counted at a period (clock) to convert the time into a digital value.

When the analog electric signal Vs1 and the reference voltage Vslop cross, the output of the comparator 25-1 is inverted to stop an input clock to the counter 25-2, and the AD conversion is then completed.

After the completion of the above-described AD conversion period, the horizontal transfer scanning circuit 23 operates to input data latched in the latches 25-3 to the signal processing circuit 28 via the horizontal transfer line 29 and the amplifier circuit 27 to generate a two-dimensional image.

In this manner, the column parallel output processing is performed.

SUMMARY OF THE INVENTION

As described above, in CMOS image sensor mounting the column parallel ADC (column AD scheme CMOS image sensor), the comparator compares a ramp wave from DAC with a pixel signal and the counter at the succeeding stage performs digital CDS, thereby performing AD conversion.

When a frame rate is increased for preview or in a draft mode, since a low current consumption is effective, the comparator of the column requires to be intermittently operated.

However, if only the current source of the comparator is controlled to be tuned off, an operation time until each node of the non-operating comparator is fixed is determined by a time constant defined by an on-resistance and a parasitic capacitor of two p-channel MOS (PMOS) transistors in series or two n-channel MOS (NMOS) transistors in series.

Therefore, an initializing operation of the non-operating comparator is slow with respect to an operation time for one row. If the initialization (hereinafter refer to as an "AZ"), the sampling of the reset signal, the AD conversion (hereinafter refer to as the "P-phase") immediately after the comparator under operating condition starts a column operation, the sampling of the pixel signal, and the AD conversion (hereinafter refer to as the "D-phase") are performed, due to the initialization failure of the non-operating comparator, an amount of feed-through and an amount of charge injection are increased when the AZ is finished in the non-operating comparator and an AC coupling for the RAMP wave is also increased, so that an amount of P-phase variation or an amount of column fixed pattern noise is increased during the intermittent operation of the column comparator, which may affect an image quality.

Accordingly, it is desirable to provide a solid-state imaging device and a camera system, which are able to reduce the amount of P-phase variation and the amount of column fixed pattern noise during the intermittent column operation, whereby the image quality may further be improved.

In accordance with one aspect of the present invention, there is provided to a solid-state imaging device capable of performing an intermittent operation that includes: a pixel unit including a plurality of pixels arranged in a matrix form, each of the pixels being configured to perform a photoelectric conversion; and a pixel signal readout circuit for reading out a pixel signal from the pixel unit in units of a plurality of pixels for each column. The pixel signal readout circuit includes a plurality of comparators disposed to correspond to a column array of pixels, and a plurality of counters whose operation are controlled by outputs of the comparators. The comparators compare a readout signal potential with a reference voltage to determine a determination signal and output the determination signal. Each of the counters counts a comparison time of a corresponding one of comparators. Each of the comparators includes an initializing switch for determining an operating point for each column at a start of row operation, and is configured so that an initialization signal to be applied to the initializing switch is controlled independently in parallel only a basic unit of the initialization signal used for a horizontal intermittent operation, and the initializing switch is held in an off-state at a start of non-operating row.

Each of the comparator may include a first amplifier including a differential transistor which receives the reference voltage at a gate of one transistor and receives the readout signal at a gate of the other transistor to perform a comparison operation between the reference voltage and the readout signal potential; and a second amplifier for outputting an output of the first amplifier with an increased gain. The first amplifier may include a first capacitor connected between a control terminal of the one transistor of the differential transistor and an input line of the reference voltage, and a second capacitor connected between a control terminal of the other transistor of the differential transistor and an input line of the readout signal. The initializing switches may be disposed between a connecting node between a gate of the one transistor and the first capacitor, and a drain of the one transistor, and between a connecting node between a gate of the other transistor and the second capacitor, and a drain of the other transistor, respectively.

An additional initializing switch may be disposed at a position at least between one of the initializing switch at a side of the one transistor and a connecting node between a gate of the one transistor and the first capacitor, among positions between the one of the initializing switch and the connecting node between the gate of the one transistor and the first transistor, and between the other of the initializing switch at a side of the other transistor and a connecting node between a gate of the other transistor and the first capacitor. The additional initializing switch may be held in an off-state when the comparator to be operated stars an operation for non-operating row.

An additional initializing switch may be disposed at a position at least between one of the initializing switch at a side of the one transistor and a connecting node between a gate of the one transistor and the first capacitor, among positions between the one of the initializing switch and the connecting node between the gate of the one transistor and the first capacitor, and between the other of the initializing switch at a side of the other transistor and a connecting node between a gate of the other transistor and the first capacitor. The additional initializing switch may be held in an on-state regardless of an operating state of the additional initializing switch.

Among positions in which the one of the initializing switch at aside of the one transistor and a connecting node between a gate of the one transistor and the first capacitor, and the initializing switch at a side of the other transistor and a connecting node between a gate of the other transistor and the first capacitor, at least the positions in which the one initializing switch and the connecting node between the gate of the one transistor and the first capacitor may be set to a fixed potential when the comparator to be operated starts an operation for non-operating row.

In accordance with another aspect of the present invention, there is provided a camera system which includes: a pixel unit including a plurality of pixels arranged in a matrix form, each of the pixels being configured to perform a photoelectric conversion; and a pixel signal readout circuit for reading out a pixel signal from the pixel unit in units of a plurality of pixels for each column. The pixel signal readout circuit includes a plurality of comparators disposed to correspond to a column array of pixels, and a plurality of counters whose operation are controlled by outputs of the comparators. The comparators compare a readout signal potential with a reference voltage to determine a determination signal and output the determination signal. Each counter counts a comparison time of a corresponding one of the comparators. Each of the comparators includes an initializing switch for determining an operating point for each column at a start of row operation, and is configured so that an initialization signal to be applied to the initializing switch is controlled independently in parallel only a basic unit of the initialization signal used for a horizontal intermittent operation, and the initializing switch is held in an off-state at a start of non-operating row.

According to one embodiment of the present invention, among the initializing switch that determines an operating point for each column at a start of row operation in the comparator, only a basic unit of the initialization signal used for a horizontal intermittent operation is independently controlled in parallel.

In the pixel signal readout circuit, a readout signal potential and the reference voltage are compared to determine a determination signal, and the determined signal is outputted. The counter is controlled the operation by the output of the comparator and counts the comparison time of the corresponding comparator.

According to one embodiment of the present invention, it is possible to reduce the amount of P-phase variation and the amount of column fixed pattern noise during the intermittent column operation, whereby the image quality can be further improved.

The above summary of the present invention is not intended to describe each illustrated embodiment or every implementation of the present invention. The figures and the detailed description which follow more particularly exemplify these embodiments.

DETAILED DESCRIPTION OF EMBODIMENTS

Hereinafter, embodiments of the present invention will be described in relation to the drawings.

Figure 3:
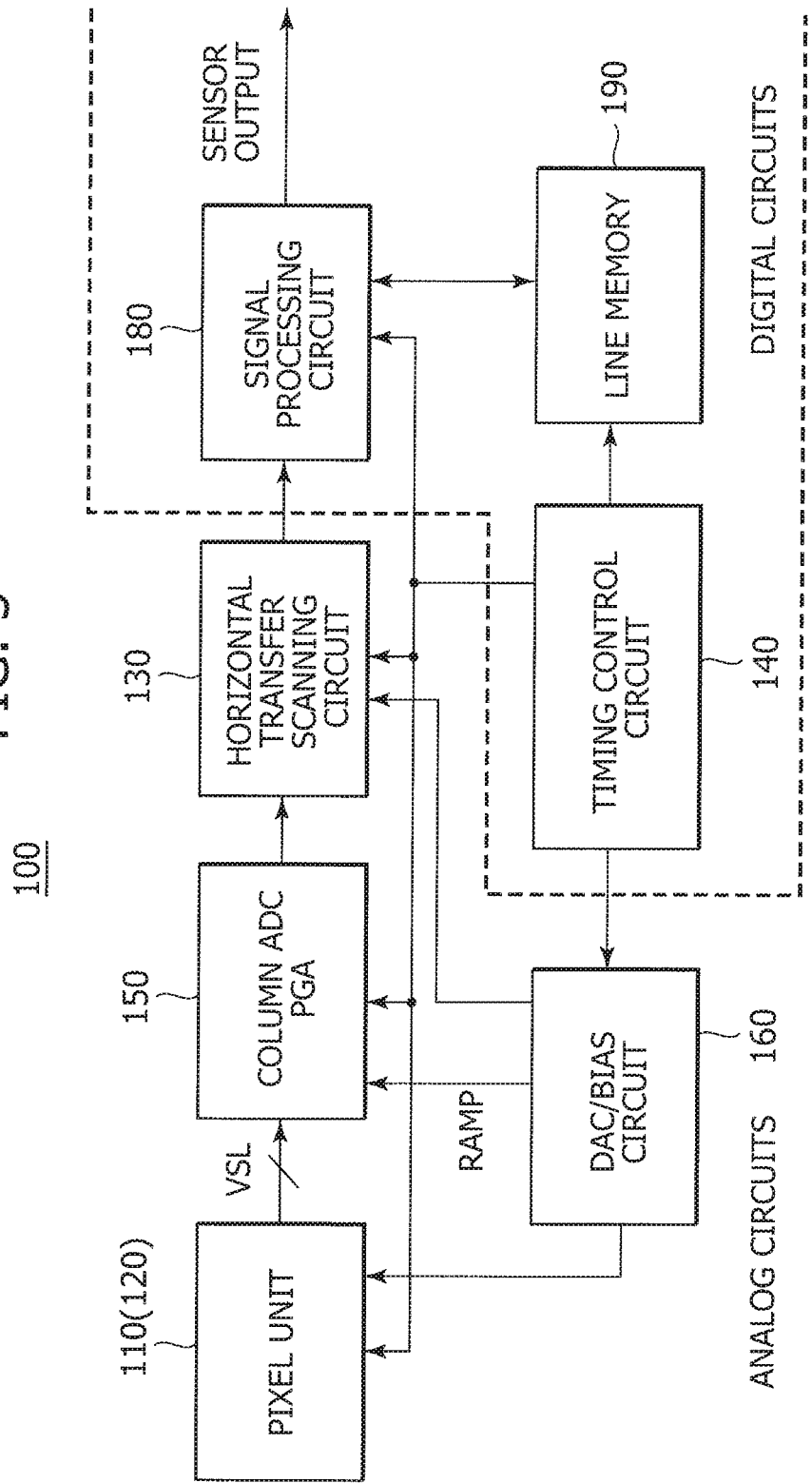
FIG. 3 is a block diagram showing a configuration example of a solid-state imaging device (CMOS image sensor) employing a column-parallel ADC according to an embodiment of the present invention.

FIG. 3 is a block diagram showing a configuration example of a solid-state imaging device (CMOS image sensor) employing a column-parallel ADC according to an embodiment of the present invention.

Figure 4:
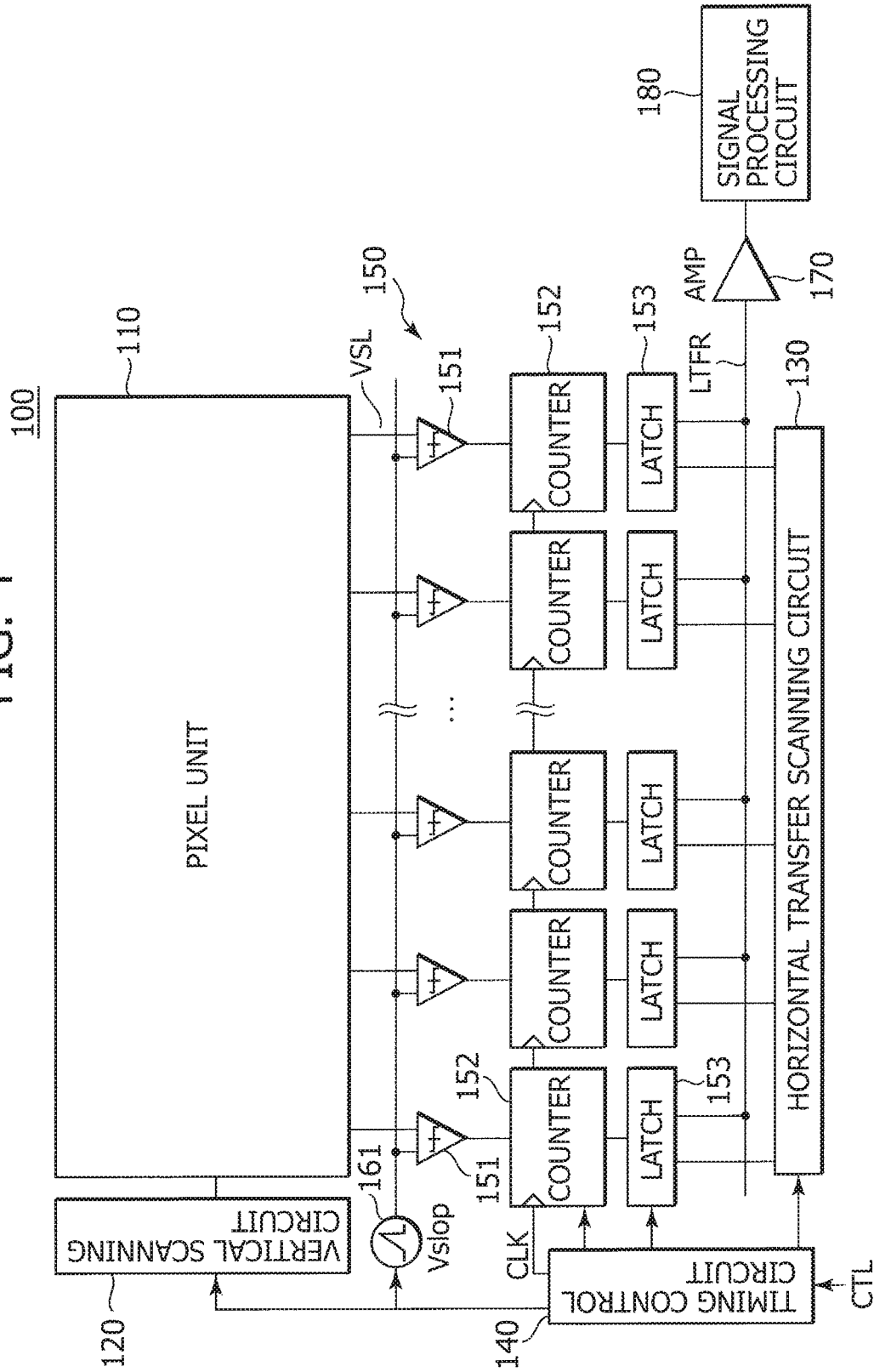
FIG. 4 is a block diagram showing more specifically an ADC group of the column-parallel ADC employed by the solid-state imaging device (CMOS image sensor) shown in FIG. 3.

FIG. 4 is a block diagram showing more specifically an ADC group of the column-parallel ADC employed by the solid-state imaging device (CMOS image sensor) shown in FIG. 3.

A solid-state imaging device 100 includes, as shown in FIGS. 3 and 4, a pixel unit 110 serving as an imager, a vertical scanning circuit 120, a horizontal transfer scanning circuit 130, a timing control circuit 140, an ADC group 150 serving as a pixel signal readout circuit, a DAC/bias circuit 160 including a DAC (digital-analog converter) 161, an amplifier circuit (S/A) 170, a signal processing circuit 180, and a line memory 190.

Among these constituent elements, the pixel unit 110, the vertical scanning circuit 120, the horizontal transfer scanning circuit 130, the ADC group 150, the DAC/bias circuit 160, and the amplifier circuit (S/A) 170 are constituted by analog circuits.

The timing control circuit 140, the signal processing circuit 180, and the line memory 190 are constituted by digital circuits.

Figure 1:
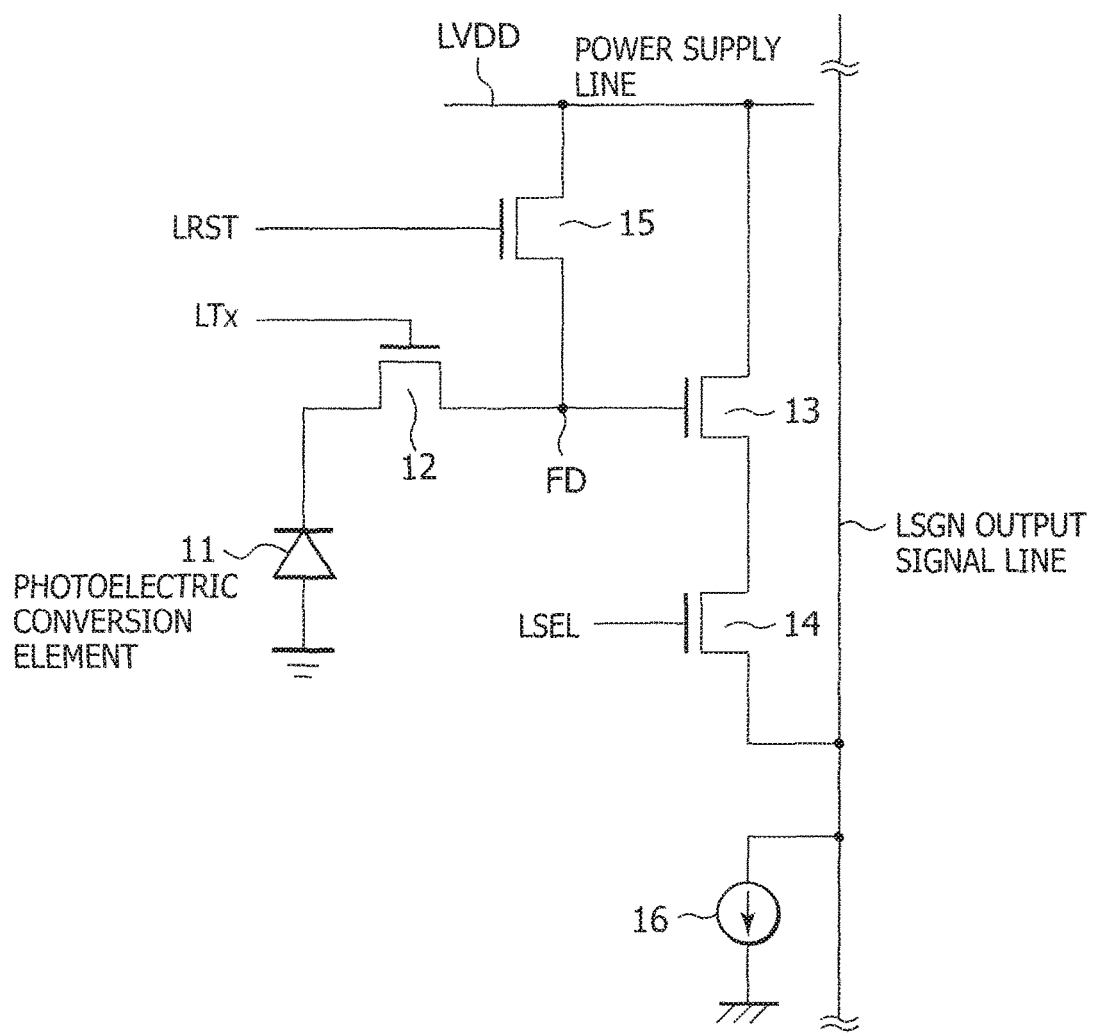
FIG. 1 is a diagram showing a configuration example of pixel of a CMOS image sensor having four transistors.
Figure 2:
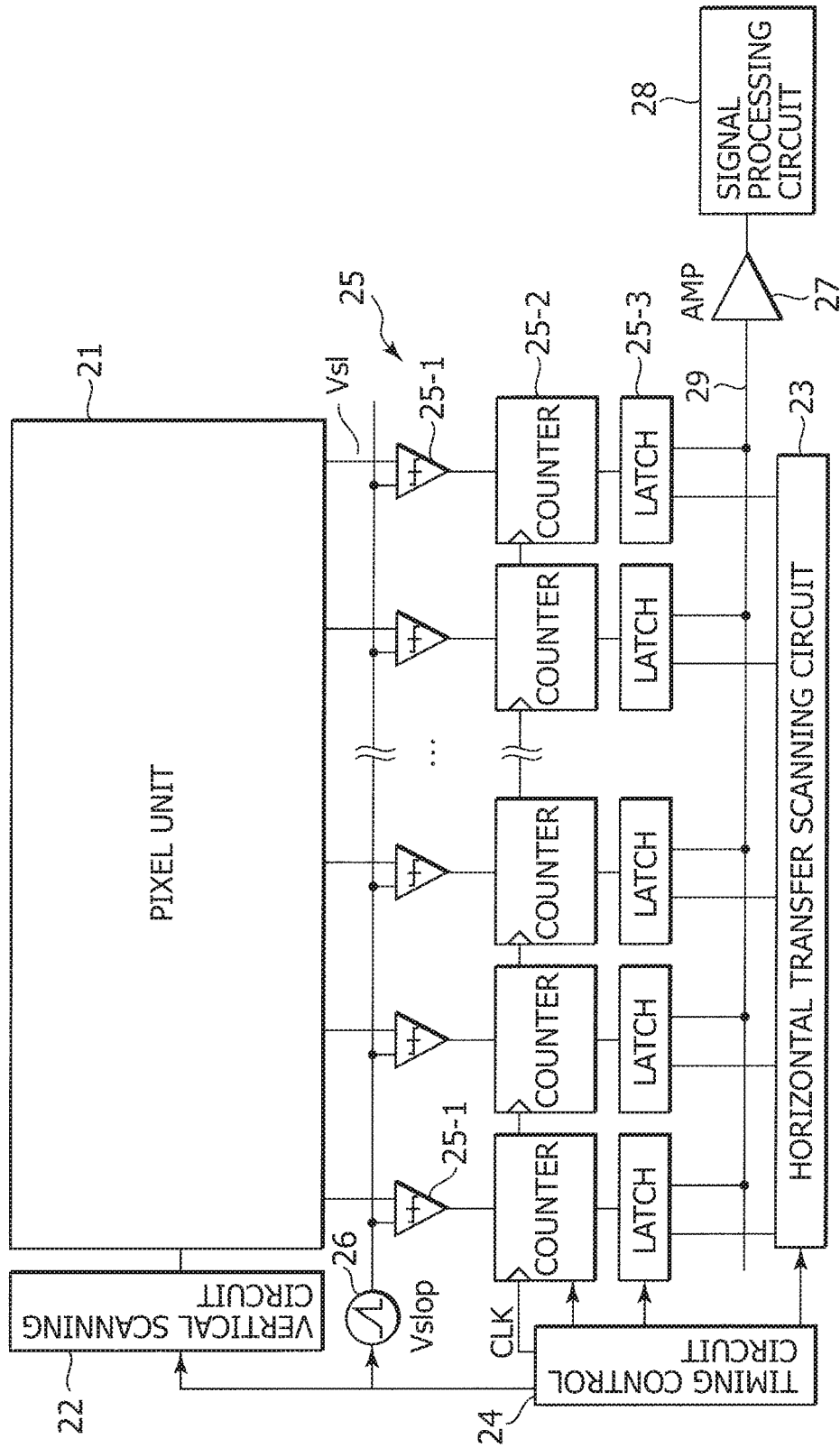
FIG. 2 is a block diagram showing a configuration example of a solid-state imaging device (CMOS image sensor) employing a column parallel ADC.

The pixel unit 110 includes photodiodes and intra-pixel amplifiers, and is constituted of pixels such as shown in FIG. 1 disposed in a matrix shape.

In the solid-state imaging device 100, the timing control circuit 140, a vertical scanning circuit 120, and a horizontal transfer scanning circuit 130 are disposed as the control circuit for sequentially reading a signal from the pixel unit 110. The timing control circuit generates internal clocks. The vertical scanning circuit 120 controls row addressing and row scanning. The horizontal transfer scanning circuit 130 controls column addressing and column scanning.

The timing control circuit 140 generates timing signals necessary for signal processing by the pixel unit 110, vertical scanning circuit 120, horizontal transfer scanning circuit 130, ADC group (column ADC circuit) 150, DAC and bias circuit 160, signal processing circuit 180, and line memory 190.

In the pixel unit 110, by utilizing photon accumulation and discharge using a line shutter, a moving image and a still image are photoelectrically converted in each pixel row, and an analog signal VSL is outputted to the ADC group.

In the ADC group 150, each ADC block (each column unit) performs for an analog output from the pixel unit 110, an APGA-compatible integrated type ADC using a ramp signal RAMP supplied from a DAC 161 and digital CDS, to output a digital signal of several bits.

In the ADC group 150, ADCs are disposed at a plurality of columns, each ADC being constituted of: a comparator 151 for comparing a reference voltage Vslop having a ramp waveform (RAMP) obtained by stepwise changing a reference voltage generated by DAC 161 with an analog signal (potential VSL) obtained from a pixel at each row via a vertical signal line; a counter 152 for counting a comparison time; and a latch 153 for holding a count result.

The ADC group 150 has an n-bit digital signal conversion function, each ADC being disposed at each vertical signal line (column line) to constitute a column parallel ADC block.

An output of each latch 153 is connected to a horizontal transfer line having, for example, a 2n-bit width.

The amplifier circuits 170 the number of which is 2n corresponding to the horizontal transfer line LTRF and a signal processing circuit 180 are disposed.

Specific structure and function of the comparator 151 will be described later in detail.

In the ADC group 150, an analog signal (potential VSL) read out to the vertical signal line is compared with the reference voltage Vslop (RAMP signal of a slope waveform having a gradient and changing linearly) at the comparator 151 disposed at each column.

In this case, the counter 152 disposed at each column similar to the comparator 151 is in operation and changes its count in one-to-one correspondence with the ramp signal RAMP (potential Vslop), to thereby converts a potential (analog signal) VSL at a vertical signal line into a digital signal.

A change in the reference voltage Vslop (ramp signal RAMP) is used for converting a voltage change into a time change, and the converted time is counted at a certain period (clock) to convert the time into a digital value.

When the analog signal VSL crosses the ramp signal RAMP (reference voltage Vslop), an output of the comparator 151 is inverted to stop an input clock to the counter 152 and complete AD conversion After completion of the above-described AD conversion period, the horizontal transfer scanning circuit 130 operates to transfer data latched in the latches 153 to a horizontal transfer line LTRF and inputted, the data to the signal processing circuit 180 via the amplifier circuit 170 to generate a two-dimensional image by predetermined signal processing.

The horizontal transfer scanning circuit 130 performs concurrent parallel transfer of several channels in order to ensure a transfer rate.

The timing control circuit 140 generates timings necessary for signal processing by respective blocks such as the pixel unit 110 and ADC group 150.

The signal processing circuit 180 at the succeeding stage performs digital signal processing for the signal stored in the line memory 190. This digital signal processing includes correction of vertical line defects and point defects, signal clamping, parallel-serial conversion, compression, encoding, addition, averaging, intermittent operation and the like.

The line memory 190 stores digital signals transmitted from each pixel row.

In the solid-state imaging device 100 of the embodiment, a digital output of the signal processing circuit 180 is transmitted as an input to an ISP and a baseband LSI.

In the ADC group (pixel signal readout circuit) 150 according to the embodiment, the comparator 151 is configured as one of first to fourth configuration examples shown below, in order to suppress the increase of the amount of feed-through and the amount of charge, injection when the AZ is finished in the non-operating comparator and also to suppress the increase of the AC coupling applied to the RAMP wave, due to the initialization failures of the no-operating comparator, and to reduce the amount of P-phase variation and the amount of column fixed pattern noise during the intermittent operation of the column comparator to improve the image quality.

In an example of the first configuration, each comparator 151 disposed at each column includes first and second amplifiers connected in cascade. Among the initialization signals to be applied to an initialization (auto zero: AZ) switch (hereinafter refer to as an "AZ switch") for determining an operating point for each column at a start of the row operation, only a basic unit of the initialization signal used for the horizontal intermittent operation is independently controlled in parallel, so that only the AZ switch of the non-operating comparator is fixed in an off-state at a start of non-operating row.

The first amplifier at a first stage performs a low speed signal comparison operation to narrow an operation bandwidth and the second amplifier at a subsequent stage increases a gain.

In each comparator in the second configuration example, an additional AZ switch is provided to dispose two AZ switches in series, and at least a switch transistor at the side of a capacitive coupling with the RAMP wave is turned off when a comparator to be operated starts the operation for the non-operating row.

In each comparator in the third configuration example, an additional AZ switch is provided to dispose two AZ switches in series, and at least the switch transistor at the side of the capacitive coupling with the RAMP wave is normally set to the on-state.

In each comparator in the forth configuration example, at least one end of the capacitive coupling with the RAMP wave the AZ switch is pulled up when the comparator to be operated starts the operation for the non-operating row.

The configuration, functions, and control of the comparator 151 will be described in detail as follows. The comparator 151 is provided with the ADC group (pixel signal readout circuit) 150 that has a characteristic configuration of the embodiment.

The following comparator will be described by given reference numeral 200.

Figure 5:
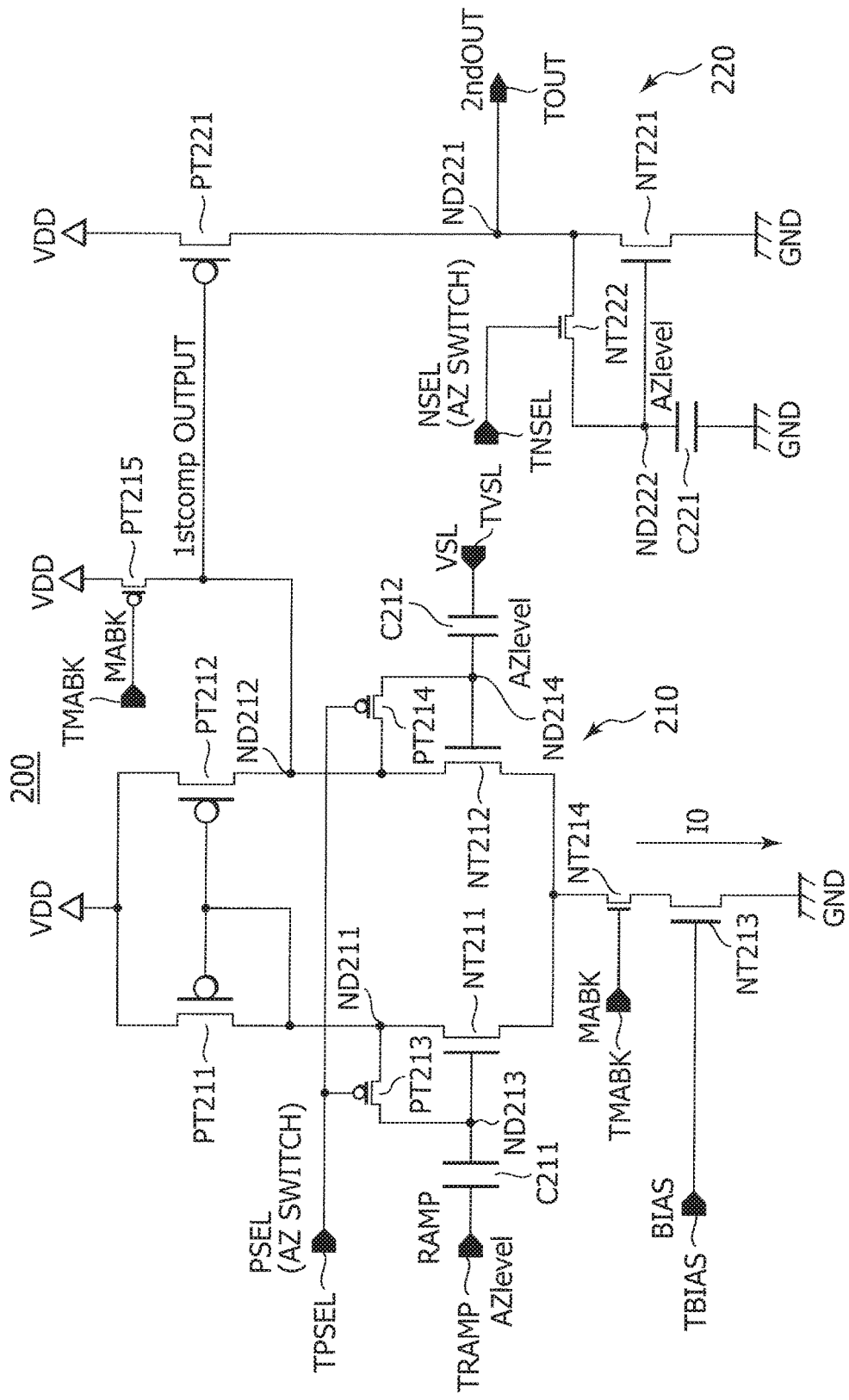
FIG. 5 is a circuit diagram showing a first configuration example of a comparator according to the embodiment.

FIG. 5 is a circuit diagram showing the first configuration example of the comparator according to the embodiment.

The comparator 200 includes a first amplifier and a second amplifier connected in cascade, as shown in FIG. 5. The first amplifier 210 performs a low speed signal comparison operation to narrow an operation bandwidth at the first stage, and the second amplifier 220 increases a gain of the output of the first amplifier 210.

The comparator 200 is configured such that, among first AZ (initialization) signals PSEL for the first amplifier 210 to be applied to the AZ switch that determines the operating point for each column at a start of the row operation, only a basic unit of the first AZ signal used for the horizontal (arrangement direction of the comparator, column direction) intermittent operation is independently controlled so that only the AZ switch of the non-operating comparator is fixed in the off-state at a start of the non-operating row.

The first amplifier 210 includes p-channel MOS (PMOS) transistors PT211 to PT214, n-channel MOS (NMOS) transistors NT211 to NT213, and a first capacitor C211 and a second capacitor C212 as sampling capacitors for an AZ level.

The sources of the PMOS transistors PT211 and PT212 are connected to a power supply potential VDD.

The drain of the PMOS transistor PT211 is connected to the drain of the NMOS transistor NT211, and a connection point therebetween constitutes a node ND211. The drain and gate of the PMOS transistor PT211 are connected, and a connection point therebetween is connected to the gate of the PMOS transistor PT212.

The drain of the PMOS transistor PT212 is connected to the drain of the NMOS transistor NT212, and a connection point therebetween constitutes an output node of the first amplifier 210.

The sources of the NMOS transistors NT211 and NT212 are connected to each other, and a connection point therebetween is connected to the drain of the NMOS transistor NT213. The source of the NMOS transistor NT213 is connected to a ground potential GND.

The gate of the NMOS transistor NT211 is connected to a first electrode of the capacitor C211, and a connection point therebetween constitutes a node ND213. A second electrode of the capacitor C211 is connected to an input terminal TRAMP for a ramp signal RAMP.

The gate of the NMOS transistor NT212 is connected to a first electrode of the capacitor C212, and a connection point therebetween constitutes a node ND214. A second electrode of the capacitor C212 is connected to an input terminal TVSL for an analog signal VSL.

The gate of the NMOS transistor NT213 is connected to an input terminal TBIAS for a bias signal BIAS.

The drain of the PMOS transistor PT213 is connected to the node ND211, and the source thereof is connected to the node ND213. The drain of the PMOS transistor PT214 is connected to the node ND213, and the source thereof is connected to the node ND214.

The gates of the PMOS transistors PT213 and PT214 are connected in common to an input terminal TPSEL for a first AZ signal PSEL which is active at a low level.

A source of the PMOS transistor PT215 is connected to the power supply potential VDD and a drain is connected to the output node ND212, and a gate is connected to the input terminal TMABK of the control signal MASK.

In the first amplifier 210 having the above-mentioned configuration, the PMOS transistors PT211 and PT212 constitute a current mirror circuit, and the NMOS transistors NT211 and NT212 constitute a comparison section for comparing a differential, with using the NMOS transistor NT213 as a current source.

The PMOS transistors PT213 and PT214 function as the AZ switches, and the capacitors C211 and C212 function as the sampling capacitors at the AZ level.

An output signal 1stcomp of the first amplifier 210 is outputted from the output node ND212 to the second amplifier 220.

The NMOS transistor NT214 has a function for turning itself off to set the first amplifier 210 in the non-operating state when the control signal MABK is at a low level, or turns itself on to set the amplifier 210 in the operating state when the control signal MABK is at a high level.

The PMOS transistor PT215 has a function for tuning itself on to fix an output line connected to the output node ND212 to the power supply potential VDD when the control signal MABK is at the low level, so that a gate input transistor of the second amplifier 220 at the subsequent stage can be surely cut off. The PMOS transistor PT215 has a function for turning off itself to transmit the output 1stcomp of the first amplifier 210 to the second amplifier 220 when the control signal MASK is at the high level.

The second amplifier 220 includes the PMOS transistor PT221, the NMOS transistors NT221 and NT222, and the sampling capacitor C221 at the AZ level.

A source of the PMOS transistor PT221 is connected to the power supply potential VDD, and a gate is connected to the output node ND212 of the first amplifier 210.

A drain of the PMOS transistor PT221 is connected to a drain of the NMOS transistor NT221, and the connection point forms an output node ND221.

A source of the NMOS transistor NT221 is connected to the ground potential GND, and a gate is connected to a first electrode of the capacitor C221, and the connection point forms a node ND222. A second electrode of the capacitor C221 is connected to the ground potential GND.

A drain of the NMOS transistor NT222 is connected to the node ND221, and a source is connected to the node ND222.

A gate of the NMOS transistor NT222 is connected in common to an input terminal TNSEL of a second AZ signal NSEL that becomes active at the high level.

The second AZ signal NSEL takes a level complementary to the first AZ signal PSEL to be supplied to the first amplifier 210.

In the second amplifier 220 having the above-mentioned configuration, the PMOS transistor PT221 constitutes an input circuit and a current source circuit.

The NMOS transistor PT222 functions as the AZ switch, and the capacitor C221 functions as the sampling capacitor at the AZ level.

The output node ND221 of the second amplifier 220 is connected to an output terminal TOUT of the comparator 200.

Next, the operation of the comparator 200 according to the embodiment is described in relation to FIGS. 6 to 9.

Figure 6:
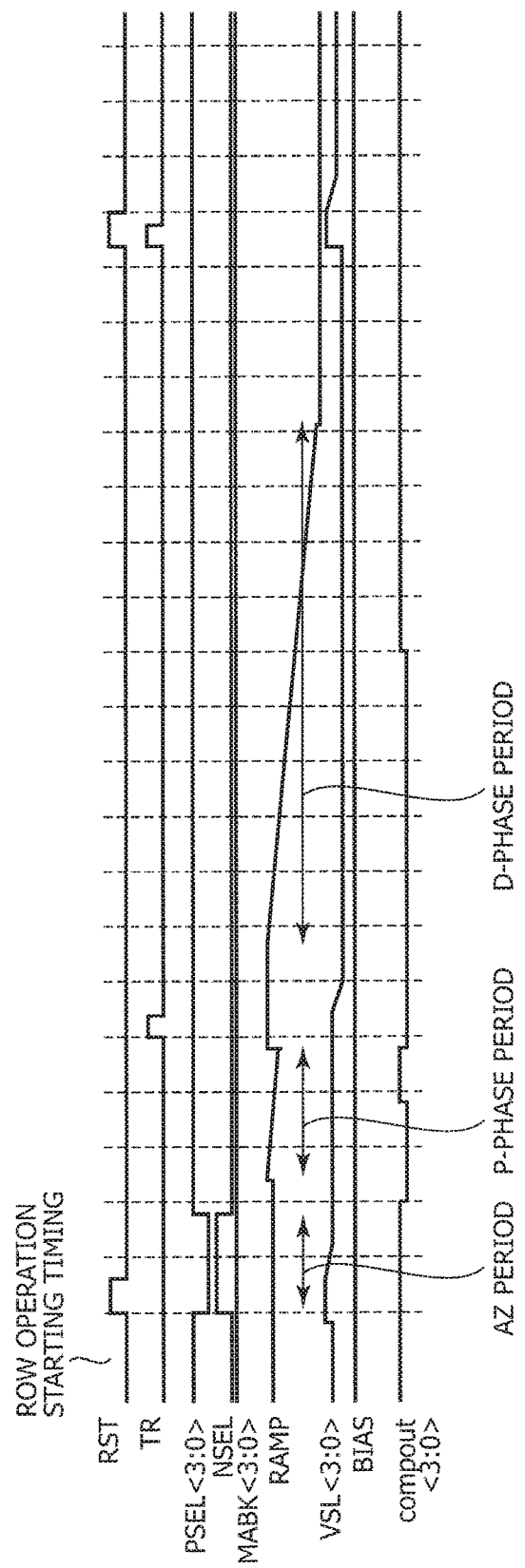
FIG. 6 shows a timing chart of the comparator according to the embodiment when all pixels are operated.

FIG. 6 shows a timing chart of the comparator according to the embodiment, when all pixels are operated.

Figure 7:
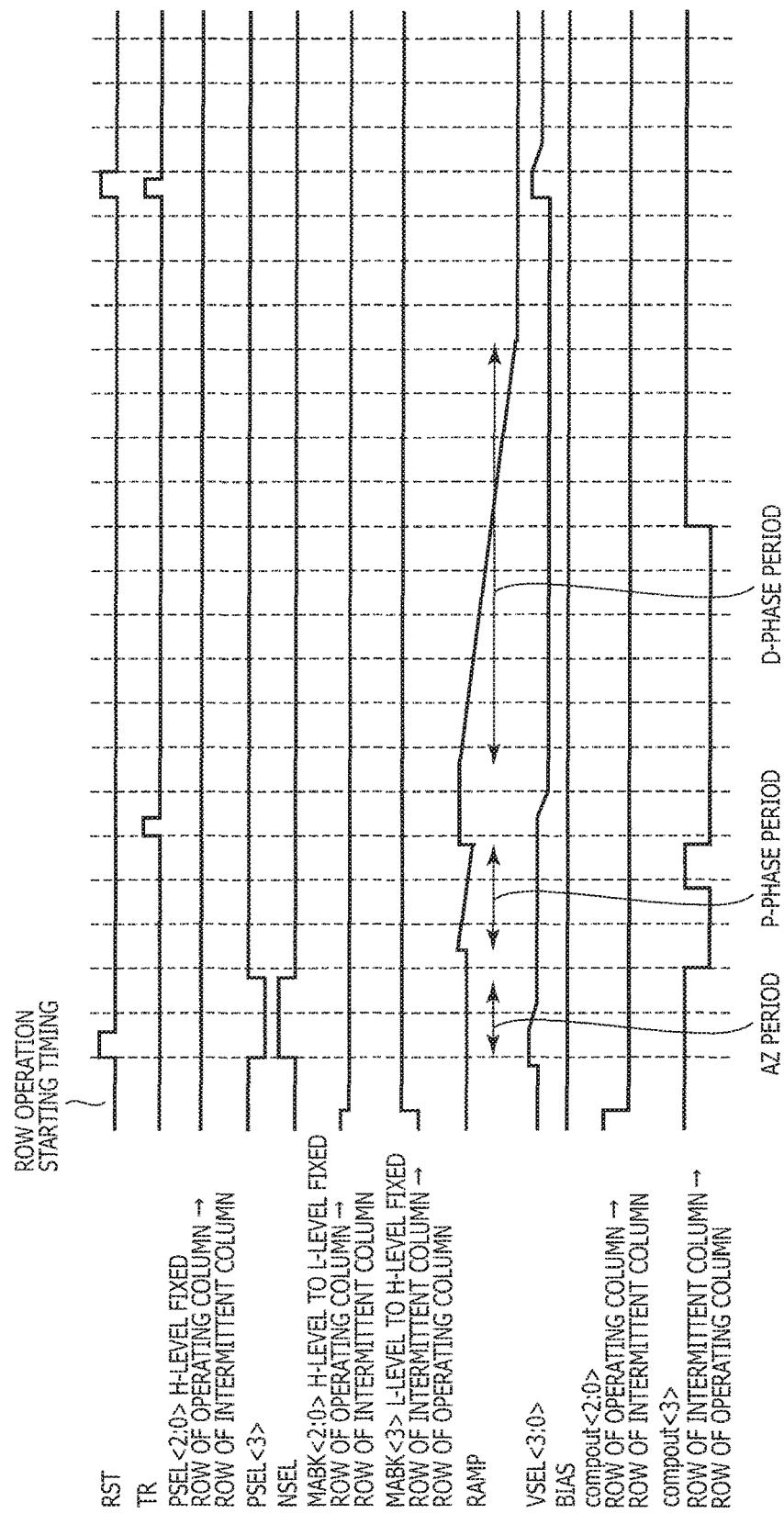
FIG. 7 is a first example of timing chart of the comparator according to the embodiment in a ¼H column intermittent operation.

FIG. 7 is a first example timing chart of the comparator according to the embodiment, in a ¼H column intermittent operation.

Figure 8:
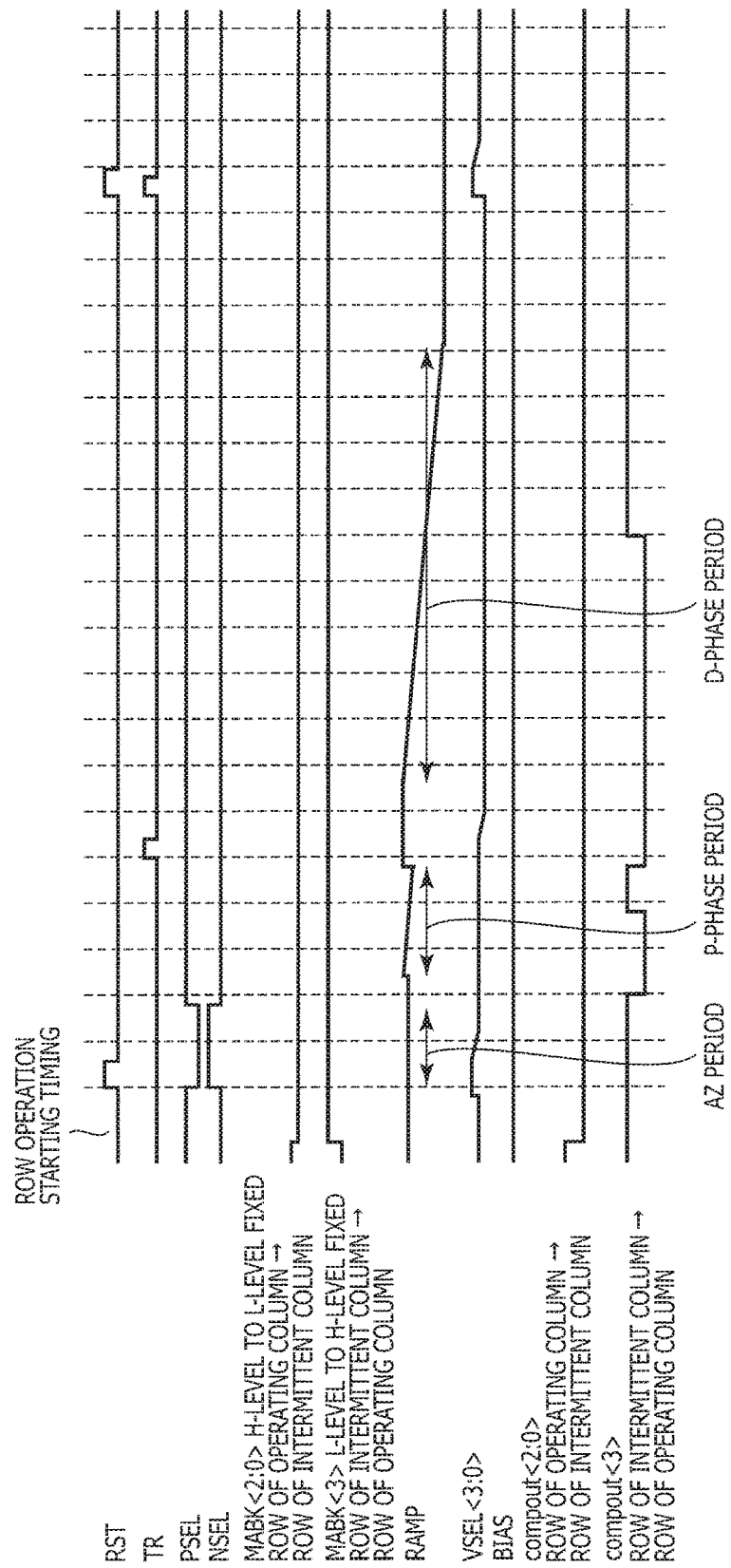
FIG. 8 is a second example of timing chart of the comparator according to the embodiment in the ¼H column intermittent operation.
Figure 9:
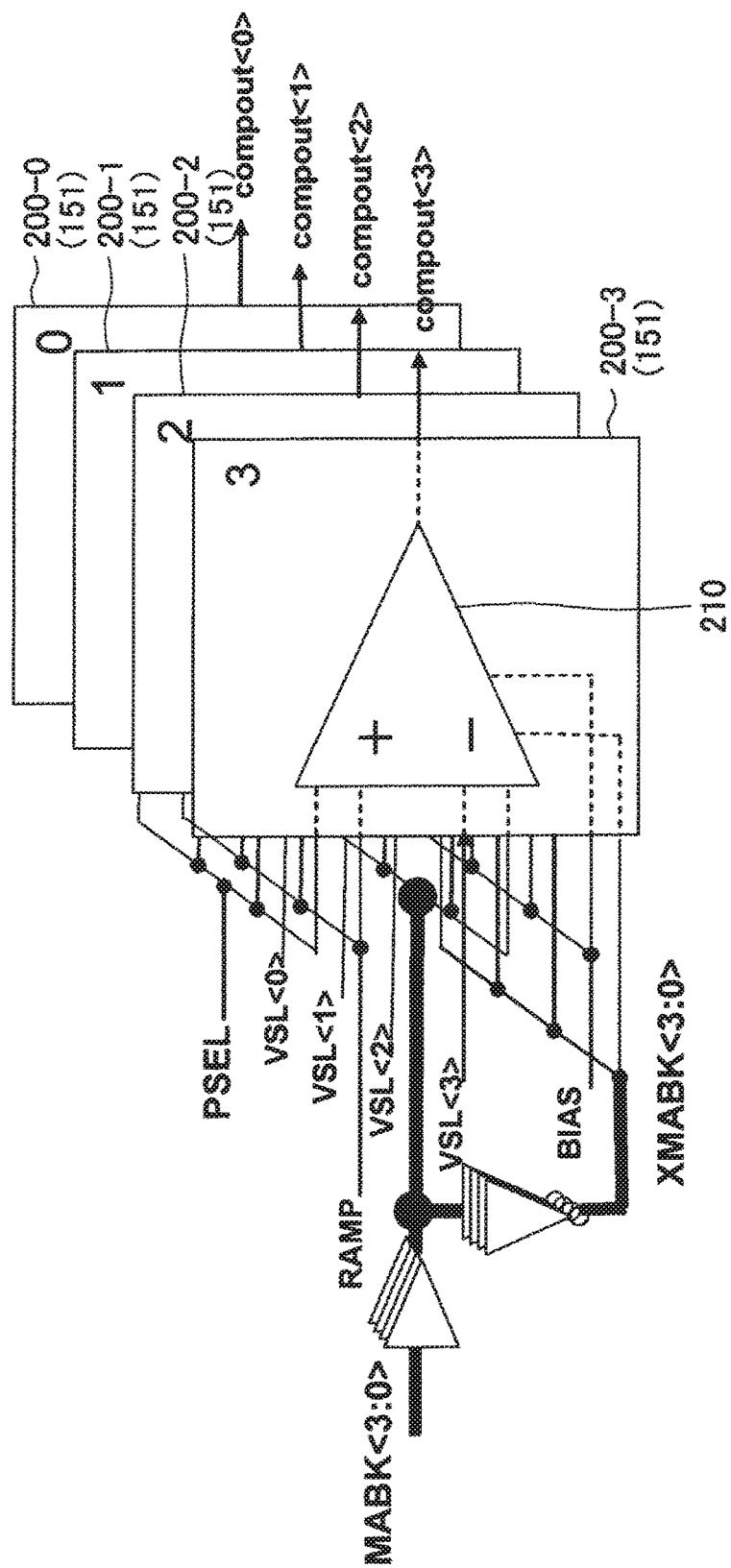
FIG. 9 is a diagram showing an example in which comparators of four columns of the first configuration example are grouped as an object to be controlled.

FIG. 8 is a second example timing chart of the comparator according to the embodiment in the ¼H column intermittent operation;

FIG. 9 is a diagram showing an example in which comparators of four columns of the first configuration example are grouped as one comparator to be operated. The one group composed of four columns is an example of a basic unit used for the horizontal intermittent operation.

In the comparator 200, during the AZ period, in order to determine the operating point for each column when the row operation is started, the first AZ signal PSEL is supplied at the low level and the second AZ signal NSEL is supplied at the high level. With these operations, the PMOS transistors PT213 and PT214 serving as the AZ switches of the first amplifier 210 are tuned on. Similarly, the NMOS transistor NT222 serving as the AZ switch of the second amplifier 220 is turned on.

Thus, in the ADC group 150, by using the comparator 200 (151), a DAC offset level, a pixel reset level, and an AZ level of each column are firstly sampled, and the electric charges are accumulated in the capacitors C211, C212, and C221 which are the sampling capacitors at the AZ level.

Namely, as shown in the timing chart of a normal operation in FIG. 6, immediately after the row operation is started, the first AZ signal PSEL is set at the low level (L) and the second AZ signal NSEL is set at the high level (H), and the AZ is performed in this pulse period.

Next, the P-phase operation is performed. In response to a reset signal RST of the pixel, the analog signal VSL is changed and compared with the ramp signal RAMP from the DAC 161, so that the AD conversion is performed on each column.

The AD conversion is performed in that the subsequent counter operation is controlled by changing the output of the comparator 200 (151) at the time of crossing a coupled signal of the analog signal VSL and the ramp signal RAMP to be supplied to the nodes ND213 and ND214 of the first amplifier 210 which has became a high impedance (HiZ) after the AZ operation of the comparator 200 (151).

The P-phase period in FIG. 6 is the timing of the above operation. From the timing chart FIG. 6, it can be seen that immediately after the P-phase period operation is started, the output signal compout is once changed to the low level and then changed to the high level at the time of crossing the RAMP wave and the analog signal VSL.

Next, a D-phase operation is performed. The AD conversion is performed as the same path of the P-phase operation. However, since, as compared with the P-phase operation, an amount of signal photoelectrically converted in the pixel in the D-phase operation is larger, a dynamic range of the AD conversion is generally expanded.

For that reason, when the AD conversion is performed as the same graduation of the P-phase RAMP wave in FIG. 6, the D-phase period becomes longer than the P-phase period. Similar to the P-phase operation, the AD conversion is performed in that the subsequent counter operation is controlled by changing the output of the comparator 200 (151) at the time of crossing a coupled signal of the analog signal VSL and the ramp signal RAMP to be supplied to the nodes ND213 and ND214 of the first amplifier 210 which has became a high impedance (HiZ) after the AZ operation of the comparator 200 (151).

The D-phase period in FIG. 6 is the timing of the above operation. From the timing chart FIG. 6, it can be seen that immediately after the P-phase period operation is finished, the output signal compout is changed to the low level again and then changed to the high level at the time of crossing the RAMP wave and the analog signal VSL.

Thus, since the AZ, the P-phase and the D-phase operations are doubly performed for each column in the same path in each row operation, intrinsic variations of each column or kTC noises are removed by the analog CDS.

In the embodiment, basically, only the basic unit of the first AZ (initialization) signal PSELs, which are serving as the AZ inputs of the comparator 200 (151), used for the horizontal intermittent operation is independently controlled in parallel by the comparator 200 (151), so that only the AZ switch of the non-operating comparator is fixed to be off-state when the operation for the non-operating row is started.

As an example, FIG. 9 shows a block diagram in which the comparators of FIG. 5 of four columns are grouped, and FIG. 7 shows a timing chart of a ¼H column intermittent operation.

The analog signal VSL, the first AZ signal PSEL, and the control signal MABK exist in each column, and the ramp signal RAMP and the bias signal BIAS are inputted in parallel for each column.

The control signal MABK is a signal to set the comparator 200 (151) of FIG. 5 in a standby state when the comparator is not operated, and is supplied to the gate of the NMOS transistor NT214. The bias signal BIAS is a DC analog signal to be supplied to the gate of the NMOS transistor NT213 serving as the constant current source of the first amplifier 210.

In order to control the horizontal intermittent operation in an analog manner, when the row operation is started, the comparator 200 (151) of the non-operating column is required to be standby state. For example, in order to set only 0-th to second columns into the non-operating state, a control signal MABK <2:0> is fixed to the low level (L) and only control signal MABK <3> is fixed to the high level (H).

In the first configuration example, for the above embodiment, not only the control signal MABK but also the first AZ signal PSEL <2:0> are fixed to the high level (H) when the row operation is started, so that the AZ switch operation of the non-operating comparator is controlled not to be performed as well.

At this time, since the AZ switch of the comparator of the operating column is turned on, the first AZ signal PSEL <3> is set to the low level as usual.

As shown in FIG. 7, although the comparator of a third column performs the AZ, the P-phase, the D-phase operations, each node of the comparators of the 0-th to second columns is set into the standby state and a current does not flow there, and the comparator output is thus fixed to the low level (L). At the same time, the feed-through or the charge injection generated by the on/off operation of the PMOS transistors PT213 and PT214 serving as the AZ switches are not transmitted to the RAMP wave through the capacitive coupling. Accordingly, it is possible to reduce the amount of P-phase variation and the amount of the column fixed pattern noise of the operating columns, during the intermittent operation of the column comparator.

Figure 10:
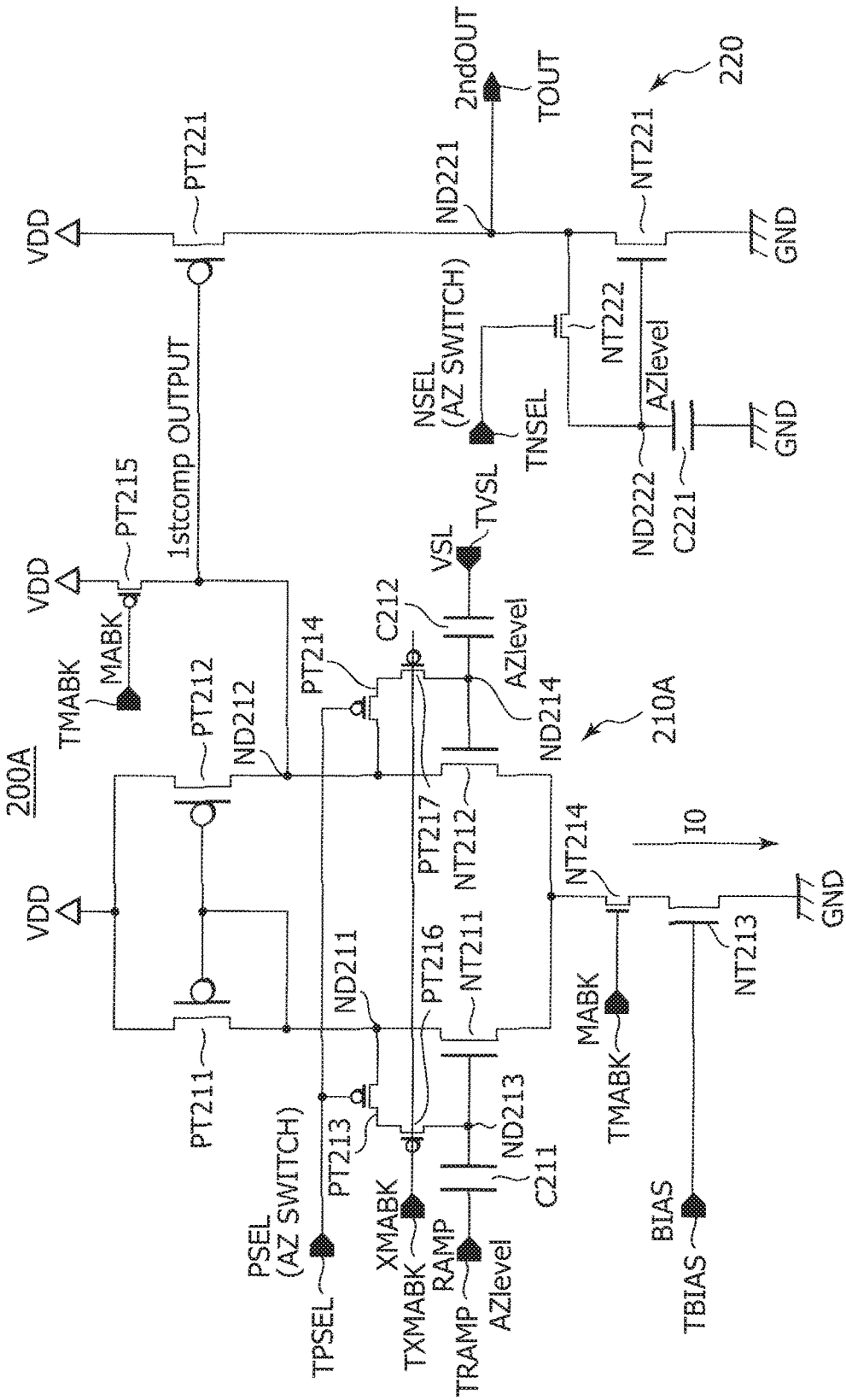
FIG. 10 is a circuit diagram showing a second configuration example of the comparator according to the embodiment.

FIG. 10 is a circuit diagram showing the second configuration example of the comparator according to the embodiment.

Figure 11:
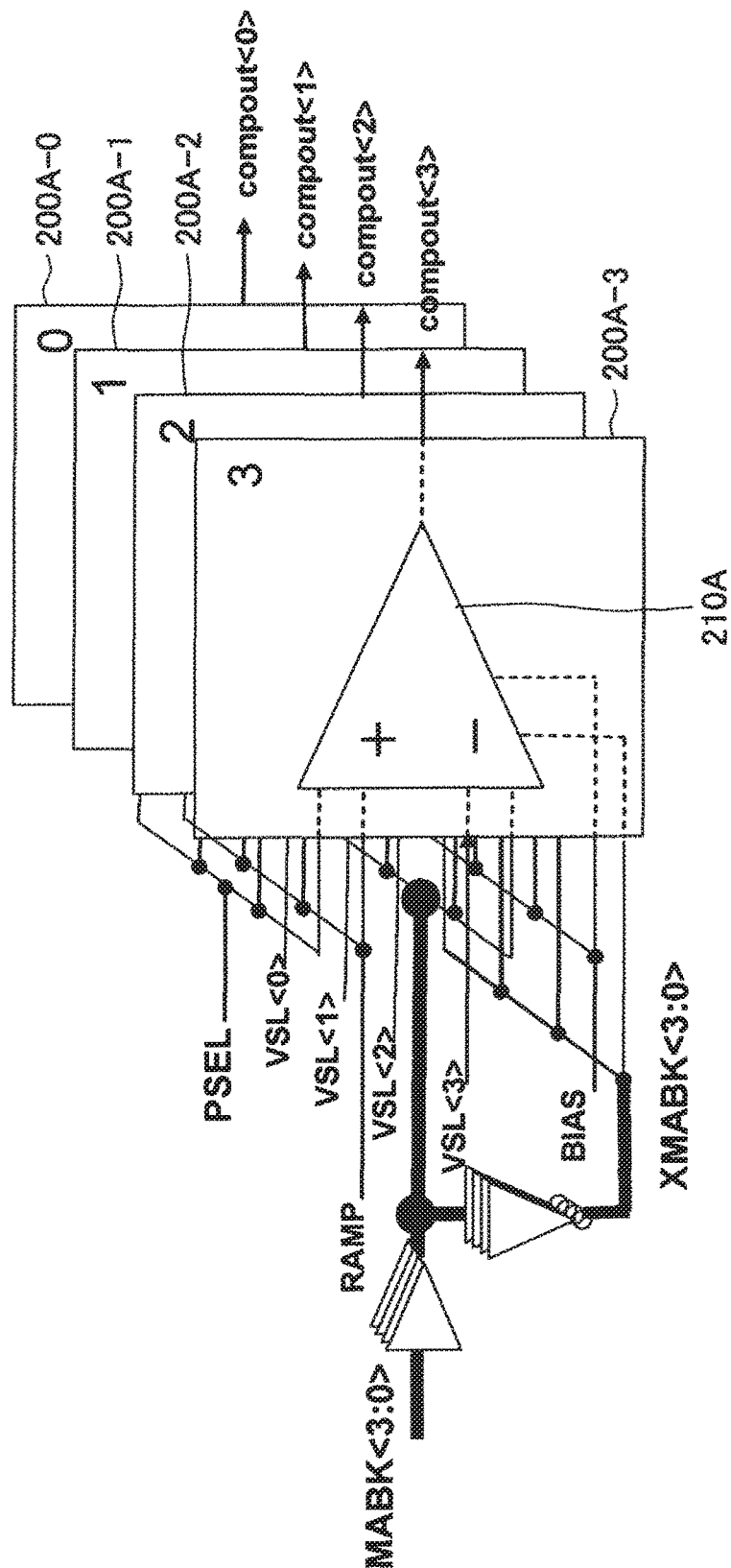
FIG. 11 is a diagram showing an example in which comparators of four columns of the second configuration example are grouped as an object to be controlled.

FIG. 11 is a diagram showing an example in which the comparators of four columns of the first configuration example are grouped as one comparator to be controlled. The one group composed of four columns in FIG. 11 is an example of a basic unit used for the horizontal intermittent operation.

A comparator 200A of the second configuration example differs from the comparator 200 of the first configuration example in that additional AZ switches are provided, at the side of nodes ND213 and ND214 of a first amplifier 210A, to dispose two AZ switches in series, and at least the switch transistor at the side of the capacitive coupling with the RAMP wave is turned off when the comparator to be operated starts the operation for the non-operating row.

More specifically, in the first amplifier 210A, a source and a drain of a PMOS transistor PT216 serving as the AZ switch are connected between the node ND213 and the source of a PMOS transistor PT213. Similarly, a source and a drain of the PMOS transistor PT217 serving as the AZ switch are connected between the node ND214 and a source of the PMOS transistor PT214.

Gates of the PMOS transistors PT213 and PT214 are commonly connected to an input terminal TXMABK of a signal XMABK which is an inverted signal of the control signal MABK.

As an example, FIG. 11 shows a block diagram in which the comparators of FIG. 10 of four columns are grouped, and FIG. 8 shows a timing chart showing the ¼H column intermittent operation of the second configuration example.

FIG. 10 differs from FIG. 9 used in the first configuration example in that the first AZ signal PSEL is inputted to all columns in parallel, and each inverted signal XMABK <3:0> of the control signal MABK <3:0> is used as a control signal and inputted to the gates of the PMOS transistors PT216, PT217 at the side of the added AZ switch at the capacitor side.

In order to control the horizontal intermittent operation in an analog manner, when the row operation is started, the comparator of the non-operating column is required to be into the standby state. For example, in order to set only 0-th to second columns into the non-operating state, the control signal MABK <2:0> is fixed to the low level (L) and only control signal MABK <3> is fixed to the high level (H).

At this time, as shown in FIGS. 8 and 11, the first AZ signal PSEL is inputted to the gates of the PMOS transistors PT213 and PT214 serving as the AZ switches of the first amplifiers 210A of all columns.

Accordingly, although the AZ switch operation is performed for all columns, each node of the comparators of the 0-th to second columns is set into the standby state, so that the current does not flow there and the comparator output is fixed to the low level (L). On the other hand, the comparator of the third column performs the AZ, the P-phase, and D-phase operations.

The feed-through or the charge injection generated by the on/off operations of the PMOS transistors PT213 and PT214 serving as the AZ switches of the non-operating comparators are not transmitted to the RAMP wave through the capacitive coupling since the PMOS transistors PT216 and PT217 added at the side of the capacitor as the additional AZ switches are in the off-state by the inverted signal XMABK <2:0> of the control signal MABK when the row operation is started, therefore it is possible to reduce the amount of P-phase variation or the amount of column fixed pattern noise of the operating columns, during the intermittent operation of the column comparator.

It is noted that, among the timing charts in FIG. 6, all column operations are shown by the timing chart where the first AZ signals PSEL are not separated for each column.

Figure 12:
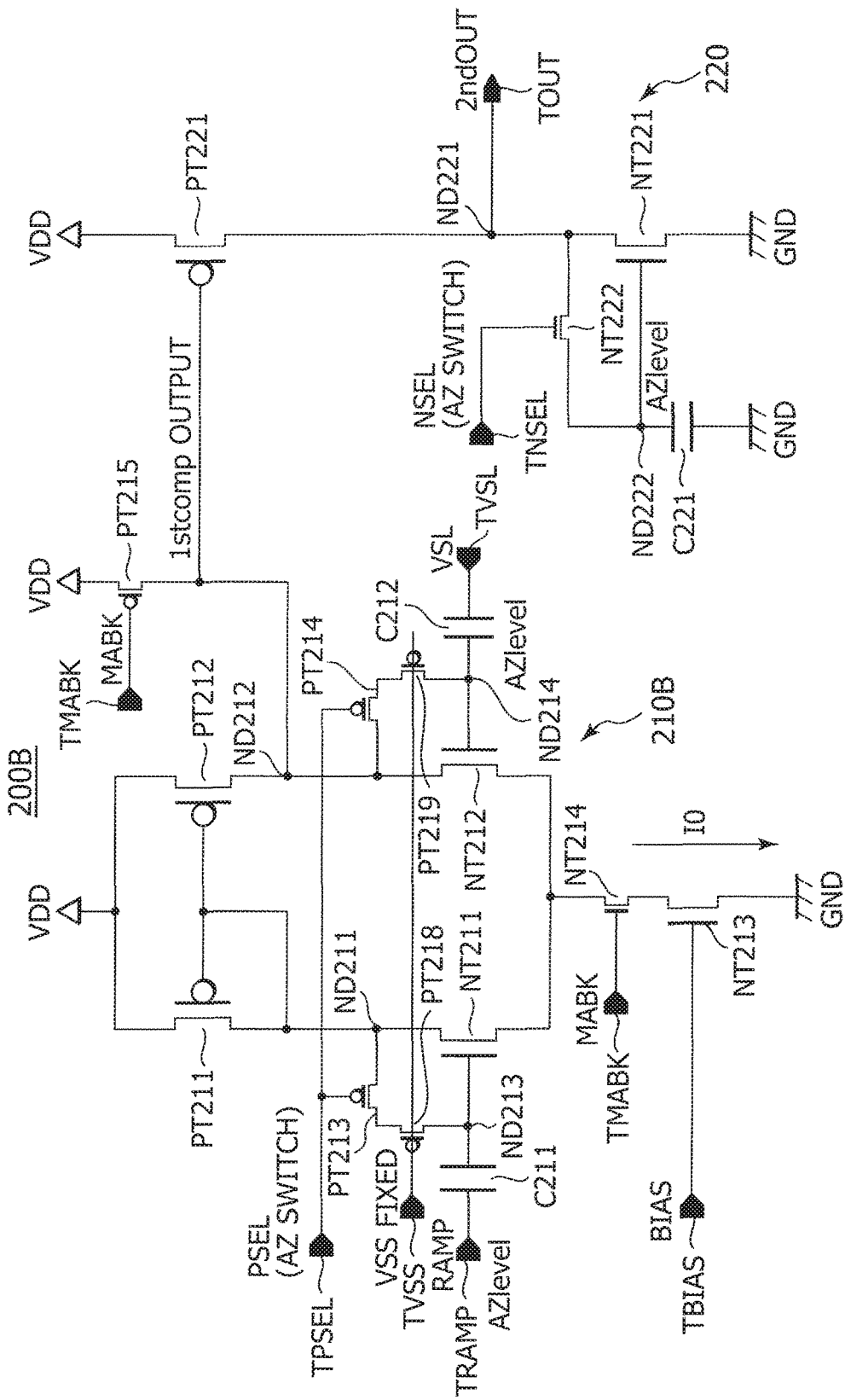
FIG. 12 is a circuit diagram showing a third configuration example of the comparator according to the embodiment.

FIG. 12 is a circuit diagram showing the third configuration example of the comparator according to the embodiment.

Figure 13:
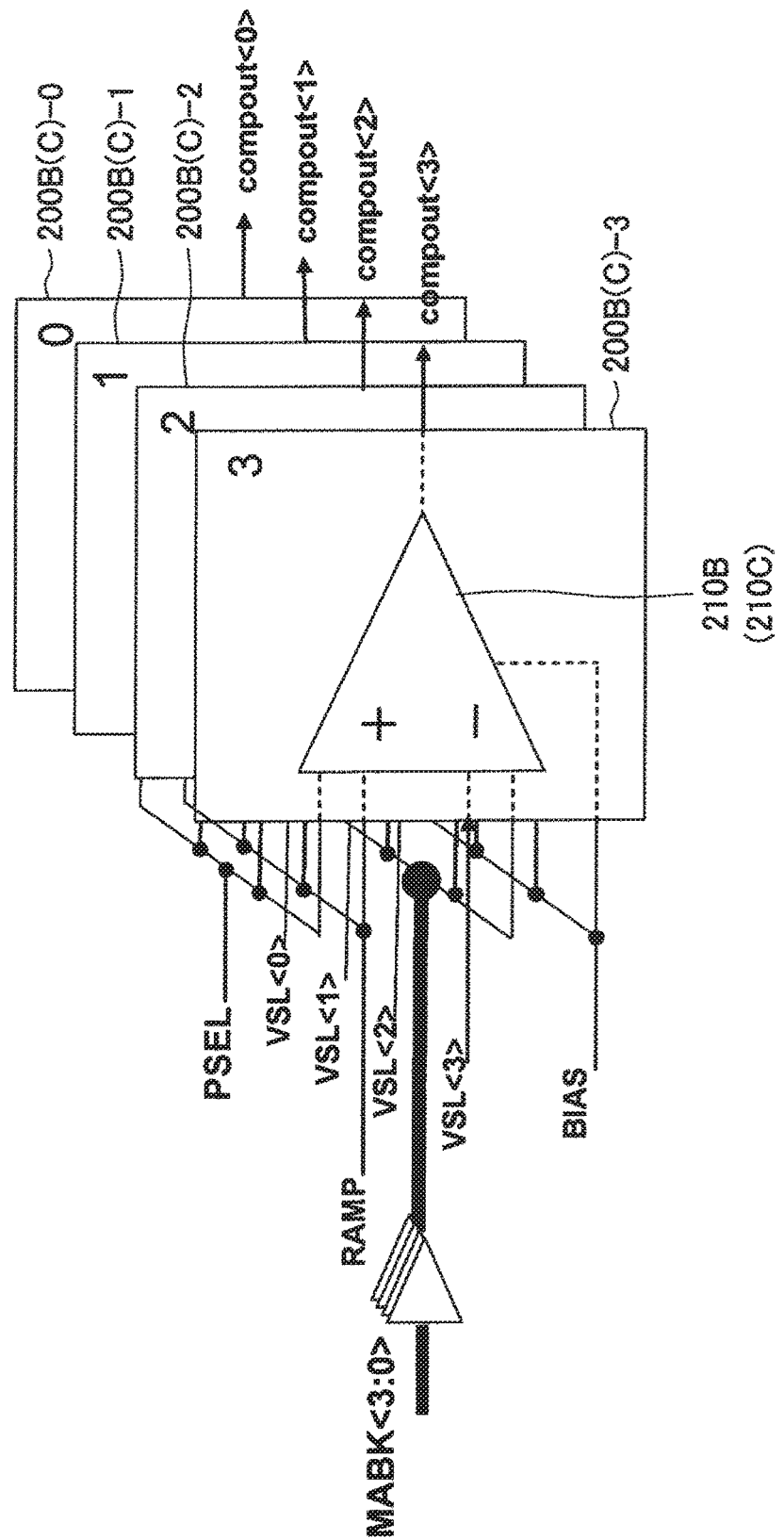
FIG. 13 is a diagram showing an example in which comparators of four columns of the third and a forth configuration examples are grouped as an object to be controlled.

FIG. 13 is a diagram showing an example in which comparators of the third and forth configuration examples of four columns are grouped as one comparator to be controlled. The one group composed of four columns of FIG. 13 is an example of a basic unit used for the horizontal intermittent operation.

A comparator 300B of the third configuration example differs from the comparator 220A of the second configuration example in that two AZ switches of the first amplifier 210A are disposed in series, and the gates of the PMOS transistors PT216 and PT217 serving as the AZ switches at the side of the capacitive coupling with the RAMP wave are connected to the fixed potential VSS to be set normally into the on-state when the comparator to be objected starts the operation for the non-operating row.

As an example, FIG. 13 shows a block diagram in which the comparators of FIG. 12 of four columns are grouped, and FIG. 8 shows a timing chart showing the ¼H column intermittent operation.

FIG. 13 differs from FIG. 11 used in the second configuration example in that the each inverted signal XMABK <3:0> of the control signal MABK <3:0> is not used, and the input of the AZ switch at the side of the added capacitor is fixed to the reference potential VSS to be set normally into the on-state during the all columns operation and during the column intermittent operation.

In order to control the horizontal intermittent operation in an analog manner, when the row operation is started, the comparator of the non-operating column is required to be into the standby state. For example, in order to set only the comparator of the 0-th to second columns into the non-operating state, the control signal MABK <2:0> is fixed to the low level (L), and only the control signal MABK <3> is fixed to the high level (H).

At this time, as shown in FIGS. 8 and 13, the first AZ signal PSEL is inputted to the gates of the PMOS transistors PT213 and PT214 serving as the AZ switches of the first amplifiers 210A of all columns.

Accordingly, although the AZ switch operation is performed for all columns, each node of the comparators of the 0-th to second columns is set into the standby state, so that the current does not flow there and the comparator output is fixed to the low level (L). On the other hand, the comparator in the third column performs the AZ, the P-phase, and D-phase operations.

The feed-through or the charge injection generated by the on/off operation of the PMOS transistors PT213 and PT214 serving as the AZ switches of the non-operating comparator is filtered out the high frequency components by an on-resistance and a source/drain-substrate capacitor, a gate-source/drain capacitor, and other wiring parasitic capacitor of the PMOS transistors PT216, PT217 serving as other AZ switches added to the capacitor side.

Accordingly, the components of the AZ switching noise transmitted to the RAMP wave through the capacitive coupling become low frequency and low amplitude, so that it is possible to reduce the amount of P-phase variation or the column fixed pattern noise amount of the operating columns, during the intermittent operation of the column comparator.

It is noted that, among the timing charts in FIG. 6, all column operations are shown by the timing chart where the first AZ signals PSEL are not separated for each column.

Figure 14:
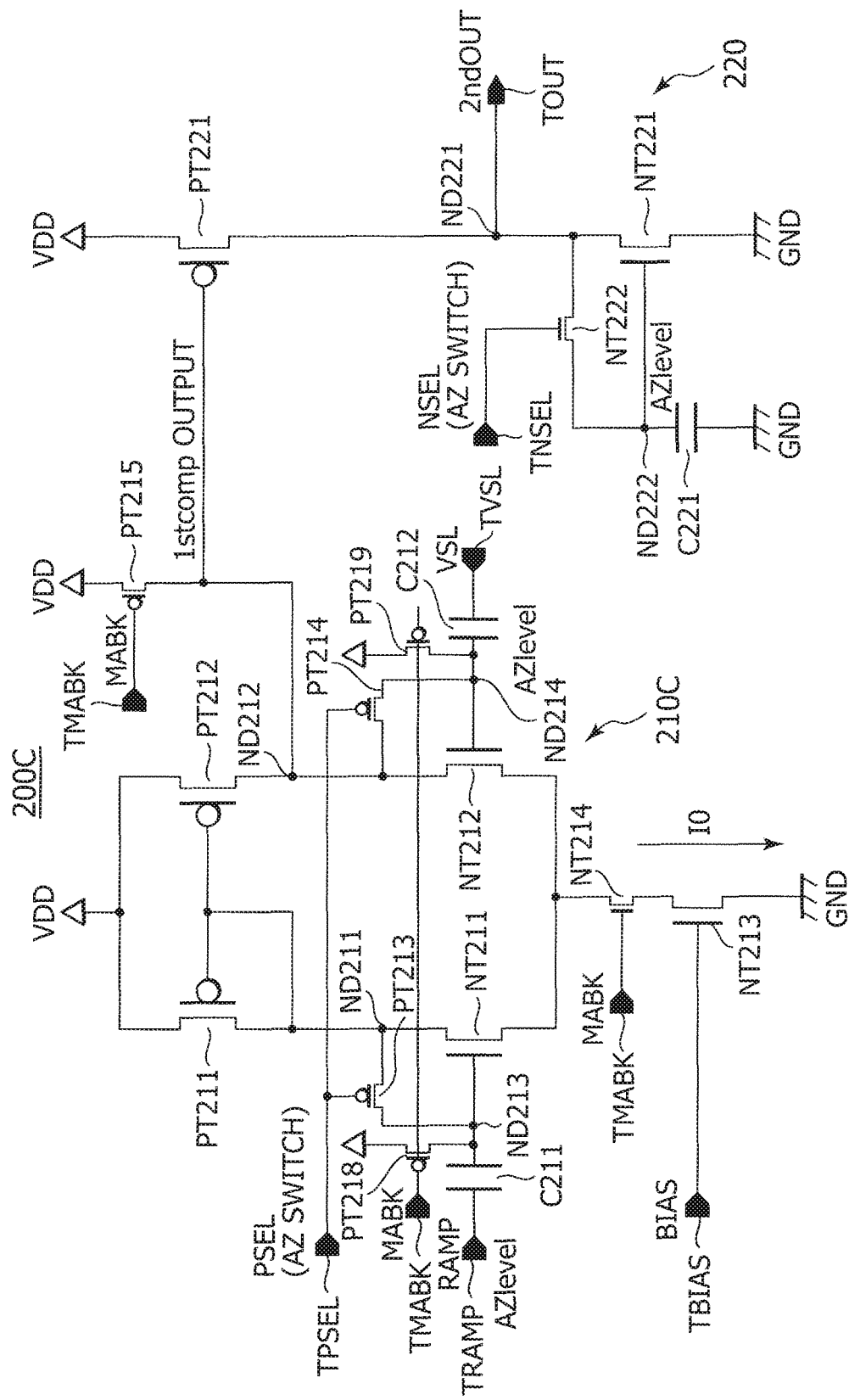
FIG. 14 is a circuit diagram showing the forth configuration example of the comparator according to the embodiment.

FIG. 14 shows a circuit diagram of the forth configuration example of the comparator according to the embodiment.

A comparator 200C of the forth configuration example differs from the comparator 220A of the second configuration example in that one end of the capacitive coupling with the RAMP wave of the AZ switch of the first amplifier 201C, that is, the nodes ND213 and ND214 are pulled up when the object comparator starts the operation for non-operating row.

More specifically, the PMOS transistor PT218 serving as a switch and the PMOS transistor PT210 are provided wherein the PMOS transistor PT 218 has a drain connected to the node ND213 and a source connected to the power supply potential VDD, and the PMOS transistor PT219 serving as a switch has a drain connected to the node ND214 and a source connected to the power supply potential VDD, and the gates of the PMOS transistors PT218, PT219 are connected to the input terminal TMABK of the control signal MABK.

As an example, FIG. 13 shows a block diagram in which the comparators of FIG. 14 of four columns are grouped, and FIG. 8 shows a timing chart showing the ¼H column intermittent operation.

The comparator 200C in FIG. 14 differs from the comparators 200A, 200B of the second and the third configuration examples in that the PMOS transistors PT213 and PT214 serving as the AZ switches are connected to the PMOS transistors PT218 and PT219 pulling up the nodes ND213 and ND214 in parallel, and the control signal MABK <3:0> is used as its input.

In order to control the horizontal intermittent operation in an analog manner, when the row operation is started, the comparator of the non-operating column is required to be into the standby state. For example, in order to set the comparators of the 0-th to second columns into the non-operating state, the control signal MABK <2:0> is fixed to the low level (L) and only control signal MABK <3> is fixed to the high level (H).

At this time, as shown in FIGS. 8 and 14, the first AZ signal PSEL is inputted to the gates of the PMOS transistors PT213 and PT214 serving as the AZ switches of the first amplifiers 200B of all columns.

Accordingly, although the AZ switch operation is performed for all columns, each node of the comparators of the 0-th to second columns is set into the standby state, so that the current does not flow there and the comparator output is fixed to the low level (L). On the other hand, the comparator of the third column performs the AZ, the P-phase, and D-phase operations.

The nodes ND213 and ND214 of the first amplifier 210 of the non-operating comparator are pulled up to an analog power supply by fixing the control signal MABK <2:0> to the low level (L) when the row operation is started. Accordingly, during the AZ operation, the feed-through or the charge injection generated by the on/off operation of the PMOS transistors PT213 and PT214 serving as the AZ switches is released to the analog power supply through the PMOS transistors PT218 and PT219 for pulling up.

Accordingly, the feed-through or the charge injection is not transmitted to the RAMP wave through the capacitive coupling, therefore it is possible to reduce the amount of P-phase variation or the amount of column fixed pattern noise of the operating columns, during the intermittent operation of the column comparator.

Note that, among the timing charts in FIG. 6, all column operations are shown by the timing chart where the first AZ signals PSEL are not separated for each column.

As described above, the solid-state imaging device according to the embodiment is configured as follows. The solid-state imaging device includes: the pixel unit 110 having a plurality of pixels arranged in a matrix form, for performing the photoelectric conversion, and the pixel signal readout circuit (ADC group) 150 for reading out data from the pixel unit 110 in units of row; wherein the ADC group 150 includes: a plurality of comparators 151 arranged corresponding to a column array of the pixels, for comparing the readout signal potential with the reference voltage to determine a determination signal and outputting the determination signal, and a plurality of counters 152 controlled to operate by the output of the comparator, for counting the comparison time of the corresponding comparator; wherein the comparator 151 includes the first and the second amplifiers connected in cascade, and among the initialization (AZ) signals to be supplied to the initializing switch (AZ switch) that determines the operating point for each column, only a basic unit of the initialization signal used for the horizontal intermittent operation is independently controlled in parallel, so that only the AZ switch of the non-operating comparator is fixed in the off-state at a start of non-operating row, or that an additional AZ switch is provided to dispose two AZ switches in series and at least the switch transistor at the side of the capacitive coupling between the RAMP wave is turned off when the object comparator starts the operation for the non-operating row, or that an additional AZ switch is provided to dispose two AZ switches in series and at least the switch transistor at the side of the capacitive coupling with the RAMP wave is normally set in the on-state, or that at least one end of the capacitive coupling with the RAMP wave of the AZ switch is pulled up when the object comparator starts the operation for the non-operating row.

With the above-described configuration, the following advantages can be obtained.

Namely, it is possible to reduce the feed-through and the charge injection applied to the high impedance (HiZ) node of the non-operating comparator, to lower the amount of column fixed pattern noise or the amount of P-phase variation during the intermittent column operation by filtering out or pulling up the high frequency noise components, and whereby the image quality can be further improved.

The solid-state imaging device having the above-mentioned advantages may be applied to an imaging device, such as a digital camera or a camcorder.

Figure 15:
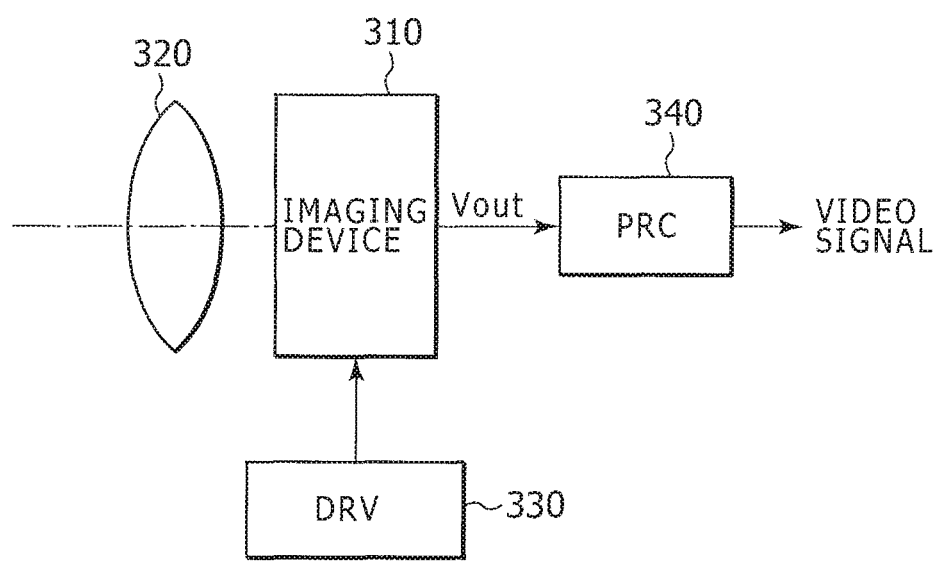
FIG. 15 is a diagram showing a configuration example of a camera system to which the solid-state imaging device according to one embodiment of the present invention is applied.

FIG. 15 is a diagram showing a configuration example of a camera system to which the solid-state imaging device according to one embodiment of the present invention is applied.

A camera system 300 includes, as shown in FIG. 15, an imaging device 310 to which the solid-state imaging device 100 according to the embodiment is applicable, an optical system guiding an incident light to a pixel area of the imaging device 310 (imaging an image of a subject), such as a lens 320 imaging an incident light (image light) on an imaging surface, a drive circuit (DRV) 330 driving the imaging device 310, and a signal processing circuit (PRC) 340 processing an output signal of the imaging device 310.

The drive circuit 330 includes a timing generator (not shown) that generates various timing signals including a start pulse and a clock pulse for driving circuits in the imaging device 310, and drives the imaging device 310 by a predetermined timing signal.

The signal processing circuit 340 performs predetermined signal processing to the output signal of the imaging device 310.

An image signal processed by the signal processing circuit 340 is recorded in a recording medium, for example, a memory. Image information recorded in the recording medium is outputted as a hardcopy by a printer and the like. Further, the image signal processed by the signal processing circuit 340 is displayed as a moving image on a monitor including a liquid crystal display.

As described above, by mounting the solid-state imaging device 100 as the imaging device 310 on the imaging device such as a digital-still camera, it is possible to achieve a high precision camera.

Although there has been shown herein and described certain embodiments of the invention, it will be understood that many changes and modifications may be made therein without departing from the spirit or scope of the invention.

The invention claimed is:

1. An imaging device comprising:
a pixel configured to output an analog signal; and
a comparator including:
a first transistor configured to receive the analog signal,
a second transistor configured to receive a reference signal,
a third transistor configured to receive a first control signal, wherein a first terminal of the third transistor is coupled to a first terminal of the first transistor,
a fourth transistor configured to receive the first control signal, wherein a first terminal of the fourth transistor is coupled to a first terminal of the second transistor,
a fifth transistor configured to receive a first fixed potential, wherein a first terminal of the fifth transistor is coupled to a second terminal of the third transistor and a second terminal of the fifth transistor is coupled to a gate of the first transistor, and
a sixth transistor configured to receive the first fixed potential, wherein a first terminal of the sixth transistor is coupled to a second terminal of the fourth transistor and a second terminal of the sixth transistor is coupled to a gate of the second transistor.

2. The imaging device according to claim 1, wherein the first fixed potential is a fixed potential VSS.

3. The imaging device according to claim 1, further comprising a seventh transistor configured to receive a second control signal, wherein a first terminal of the seventh transistor is coupled to a second terminal of the first transistor and a second terminal of the second transistor, and a second terminal of the seventh transistor is coupled to a second fixed potential.

4. The imaging device according to claim 3, wherein the second fixed potential is a ground potential.

5. The imaging device according to claim 1, further comprising an eighth transistor configured to receive a second control signal, wherein a first terminal of the eighth transistor is coupled to one of the first terminal of the first transistor and the first terminal of the second transistor, and a second terminal of the seventh transistor is coupled to a second fixed potential.

6. The imaging device according to claim 5, wherein the second fixed potential is a power supply potential VDD.

7. A light detecting device comprising:
a pixel configured to output an analog signal; and
a comparator including:
a first transistor configured to receive the analog signal,
a second transistor configured to receive a reference signal,
a third transistor configured to receive a first control signal, wherein a first terminal of the third transistor is coupled to a first terminal of the first transistor,
a fourth transistor configured to receive the first control signal, wherein a first terminal of the fourth transistor is coupled to a first terminal of the second transistor, a fifth transistor configured to receive a first fixed potential, wherein a first terminal of the fifth transistor is coupled to a second terminal of the third transistor and a second terminal of the fifth transistor is coupled to a gate of the first transistor, and a sixth transistor configured to receive the first fixed potential, wherein a first terminal of the sixth transistor is coupled to a second terminal of the fourth transistor and a second terminal of the sixth transistor is coupled to a gate of the second transistor.

8. The light detecting device according to claim 7, wherein the first fixed potential is a fixed potential VSS.

9. The light detecting device according to claim 7, further comprising a seventh transistor configured to receive a second control signal, wherein a first terminal of the seventh transistor is coupled to a second terminal of the first transistor and a second terminal of the second transistor, and a second terminal of the seventh transistor is coupled to a second fixed potential.

10. The light detecting device according to claim 9, wherein the second fixed potential is a ground potential.

11. The light detecting device according to claim 7, further comprising an eighth transistor configured to receive a second control signal, wherein a first terminal of the eighth transistor is coupled to one of the first terminal of the first transistor and the first terminal of the second transistor, and a second terminal of the seventh transistor is coupled to a second fixed potential.

12. The light detecting device according to claim 11, wherein the second fixed potential is a power supply potential VDD.

* * * * *